United States Patent
Mori et al.

(10) Patent No.: US 12,463,648 B2
(45) Date of Patent: Nov. 4, 2025

(54) PHASE SYNCHRONIZATION CONTROL CIRCUIT AND POWER CONVERSION DEVICE USING THE SAME

(71) Applicant: TOSHIBA MITSUBISHI-ELECTRIC INDUSTRIAL SYSTEMS CORPORATION, Tokyo (JP)

(72) Inventors: Daiki Mori, Chuo-ku (JP); Masamichi Kano, Chuo-ku (JP); Kazunori Sanada, Chuo-ku (JP)

(73) Assignee: TMEIC CORPORATION, Tokyo (JP)

( * ) Notice: Subject to any disclaimer, the term of this patent is extended or adjusted under 35 U.S.C. 154(b) by 0 days.

(21) Appl. No.: 18/682,053

(22) PCT Filed: Jun. 17, 2022

(86) PCT No.: PCT/JP2022/024374
§ 371 (c)(1),
(2) Date: Feb. 7, 2024

(87) PCT Pub. No.: WO2023/243091
PCT Pub. Date: Dec. 21, 2023

(65) Prior Publication Data
US 2025/0007524 A1    Jan. 2, 2025

(51) Int. Cl.
*H02M 1/08* (2006.01)
*H02J 9/06* (2006.01)
*H03L 7/085* (2006.01)

(52) U.S. Cl.
CPC .............. *H03L 7/085* (2013.01); *H02J 9/062* (2013.01); *H02M 1/08* (2013.01)

(58) Field of Classification Search
CPC .. H02J 9/062; H02M 1/08; H03L 7/08; H03L 7/085

USPC .................................................. 327/156, 159
See application file for complete search history.

(56) References Cited

U.S. PATENT DOCUMENTS 6,947,514 B1 * 9/2005 Kato ...................... H03L 7/113
375/376

FOREIGN PATENT DOCUMENTS

JP    2021-180538 A    11/2021

OTHER PUBLICATIONS

International Search Report issued Aug. 23, 2022 in PCT/JP2022/024374, filed on Jun. 17, 2022, 3 pages.

* cited by examiner

*Primary Examiner* — William Hernandez
(74) *Attorney, Agent, or Firm* — Oblon, McClelland, Maier & Neustadt, L.L.P.

(57) ABSTRACT

A phase synchronization control circuit includes: a phase difference detector that detects a phase difference between AC voltage and an AC signal, a frequency control circuitry that generates a first frequency control value to eliminate the phase difference, a frequency limiter that limits the first frequency control value to fall within a variable limit range to generate a second frequency control value, a limiter control circuitry that sets the variable limit range based on the phase difference and reduces the variable limit range in width in response to the phase difference decreasing, and an oscillator that generates the AC signal with a frequency of a value corresponding to the second frequency control value. This can suppress overshooting of the AC signal in frequency to be small.

13 Claims, 15 Drawing Sheets

FIG.4
(A)
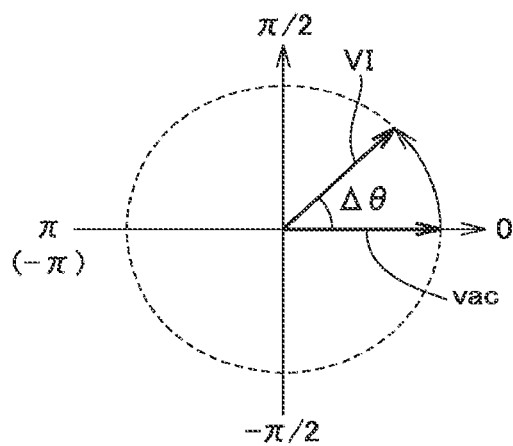
(B)
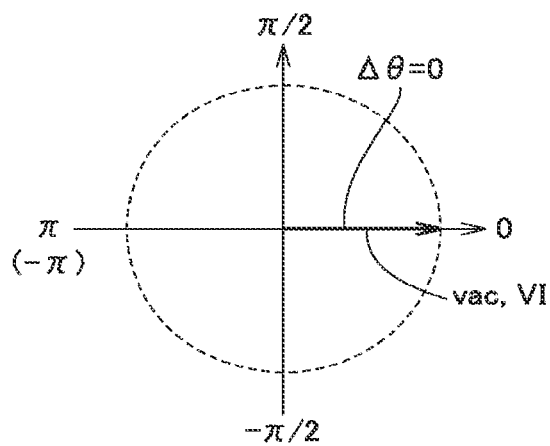
(C)
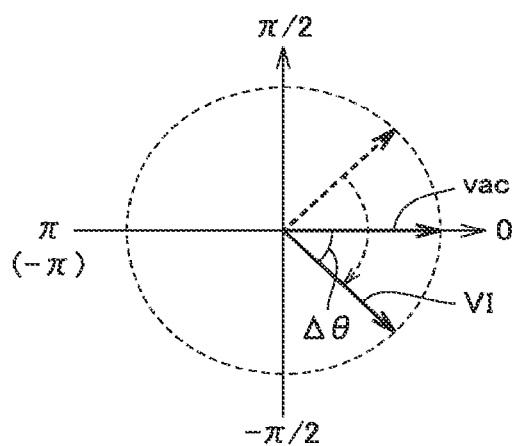

PHASE SYNCHRONIZATION CONTROL CIRCUIT AND POWER CONVERSION DEVICE USING THE SAME

TECHNICAL FIELD

The present disclosure relates to a phase synchronization control circuit and a power conversion device using the same, and more specifically to a phase synchronization control circuit that generates a second alternate-current (AC) signal in phase with a first AC signal and a power conversion device using the same.

BACKGROUND ART

For example, PTL 1 (Japanese Patent Laying-Open No. 2021-180538) discloses a phase synchronization control circuit that comprises a phase difference detector, a frequency control unit, a frequency limiter, a limiter control unit, and an AC signal generation unit, and generates a second AC signal in phase with a first AC signal.

The phase difference detector detects a phase difference between the first and second AC signals. The frequency control unit generates a first frequency control value to eliminate the phase difference. The frequency limiter limits the first frequency control value to a variable limit range to generate a second frequency control value. The limiter control unit changes the variable limit range in width from a minimum value to a maximum value in response to a zero cross point of the phase difference. The AC signal generation unit outputs the second AC signal with a frequency of a value corresponding to the second frequency control value.

In this phase synchronization control circuit, the frequency limiter's variable limit range is increased in width from the minimum value to the maximum value in response to the zero cross point of the phase difference of the first and second AC signals, and the second AC signal's frequency variation can thus be suppressed to be small.

PTL 1 also discloses a power conversion device that generates AC voltage in synchronization with the second AC signal and supplies the AC voltage to a load.

CITATION LIST

Patent Literature

[PTL 1] Japanese Patent Laying-Open No. 2021-180538

SUMMARY OF INVENTION

Technical Problem

In the conventional phase synchronization control circuit, however, the frequency limiter's variable limit range has a width set to the minimum value until the zero-cross point of the phase difference is detected, and there is a possibility that a long period of time may be required to cause the two AC signals to match in phase and frequency.

Further, there is a possibility that the above power conversion device may cause a negative effect on the load when the second AC signal rapidly changes in frequency.

Accordingly, it is a main object of the present disclosure to provide a phase synchronization control circuit capable of suppressing frequency variation of a second AC signal to be small and allowing first and second AC signals to quickly match in phase and frequency, and a power conversion device using the same.

Another object of the present disclosure is to provide a phase synchronization control circuit capable of preventing the second AC signal from rapidly changing in frequency, and a power conversion device using the same.

Solution to Problem

A phase synchronization control circuit according to the present disclosure is a phase synchronization control circuit that generates a second AC signal in phase with a first AC signal and comprises a phase difference detector, a frequency control unit, a frequency limiter, a limiter control unit, and an AC signal generation unit. The phase difference detector detects a phase difference between the first and second AC signals. The frequency control unit generates a first frequency control value to eliminate the phase difference. The frequency limiter limits the first frequency control value to fall within a first limit range to generate a second frequency control value. The limiter control unit sets the first limit range based on the phase difference, and reduces the first limit range in width in response to the phase difference decreasing. The AC signal generation unit generates the second AC signal with a frequency of a value corresponding to the second frequency control value.

Another phase synchronization control circuit according to the present disclosure is a phase synchronization control circuit that generates a second AC signal in phase with a first AC signal and comprises a phase difference detector, a frequency control unit, an amount-of-change limiter, and an AC signal generation unit. The phase difference detector detects a phase difference between the first and second AC signals. The frequency control unit generates a first frequency control value to eliminate the phase difference. The amount-of-change limiter limits an amount of change per unit time of the first frequency control value to fall within a limit range to generate a second frequency control value. The AC signal generation unit generates the second AC signal with a frequency of a value corresponding to the second frequency control value.

Advantageous Effects of Invention

The phase synchronization control circuit according to the present disclosure reduces the frequency limiter's limit range in width in response to the first and second AC signals' phase difference decreasing, and can thus suppress the second AC signal's overshoot in frequency to be small. This can suppress the second AC signal's frequency variation to be small and also allows the first and second AC signals to quickly match in phase and frequency.

Another phase synchronization control circuit according to the present disclosure is provided with an amount-of-change limiter between the frequency control unit and the oscillator to limit an amount of change per unit time of a frequency control value to fall within a limit range, and can thus prevent the second AC signal from rapidly changing in frequency.

BRIEF DESCRIPTION OF DRAWINGS

FIG. 4 is a diagram for illustrating a principle of the present disclosure.

DESCRIPTION OF EMBODIMENTS

First Embodiment

Figure 1:
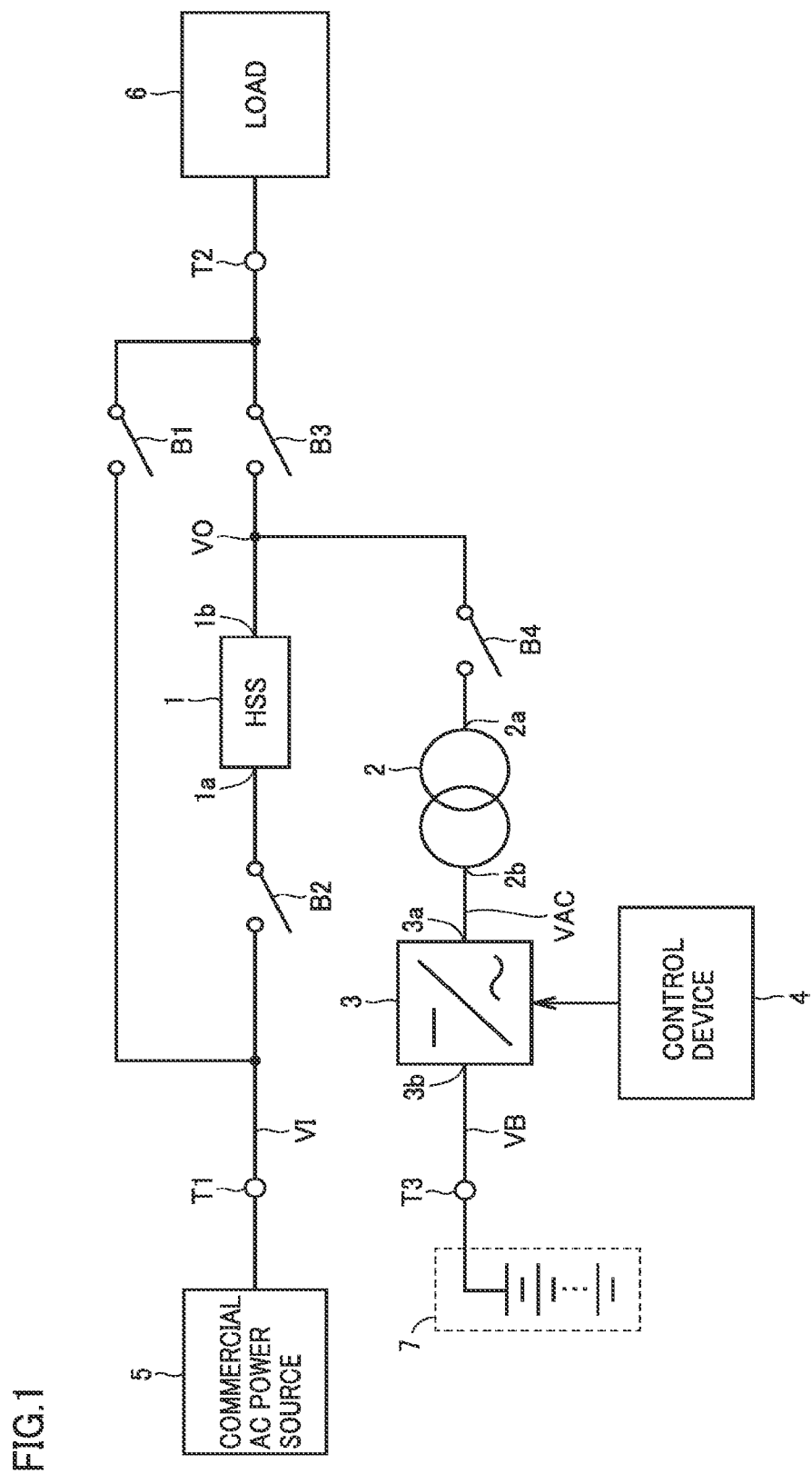
FIG. 1 is a circuit block diagram showing a configuration of a power conversion device according to a first embodiment of the present disclosure.

FIG. 1 is a circuit block diagram showing a configuration of a power conversion device according to a first embodiment of the present disclosure. While the power conversion device supplies a load 6 with a three-phase AC voltage supplied from a commercial AC power source 5 or a bidirectional converter 3, FIG. 1 only shows a portion associated with one phase in order to simplify the figure and illustration.

In FIG. 1, the power conversion device comprises an input terminal T1, an output terminal T2, a direct-current (DC) terminal T3, breakers B1 to B4, a high speed switch (HSS) 1, a transformer 2, a bidirectional converter 3, and a control device 4.

Input terminal T1 receives AC voltage VI of a commercial frequency supplied from commercial AC power source 5. An instantaneous value of AC voltage VI is detected by control device 4. Output terminal T2 is connected to load 6. Load 6 is driven by AC voltage supplied from the power conversion device. DC terminal T3 is connected to a battery 7 (a DC power source). Battery 7 stores DC power. A capacitor may be connected in place of battery 7.

When the power conversion device is used as an uninterruptible power supply device, battery 7 (or a capacitor) of a large capacity is used. When the power conversion device is used as a voltage sag compensation device, battery 7 (or a capacitor) of a small capacity is used. Battery 7's inter-terminal voltage VB is detected by control device 4.

Each breaker B1 to B4 is, for example, a vacuum circuit breaker (VCB). Breaker B1 is connected between input terminal T1 and output terminal T2. When the power conversion device is used, breaker B1 is turned off. When the power conversion device undergoes maintenance, breaker B1 is turned on, and AC voltage VI from commercial AC power source 5 is supplied to load 6 via breaker B1.

Breaker B2 is connected between input terminal T1 and one terminal 1a of high speed switch 1. Breaker B3 is connected between the other terminal 1b of high speed switch 1 and output terminal T2. When the power conversion device is used, breakers B2 and B3 are turned on. When the power conversion device undergoes maintenance, breakers B2 and B3 are turned off.

High speed switch 1 for example comprises a semiconductor switching element, and is controlled by control device 4. When commercial AC power source 5 is sound, high speed switch 1 is turned on, and AC voltage VI from commercial AC power source 5 is supplied to load 6 via breaker B2, high speed switch 1, and breaker B3. When commercial AC power source 5 fails, high speed switch 1 is turned off to electrically disconnect commercial AC power source 5 from load 6. An instantaneous value of AC voltage VO appearing at the other terminal 1b of high speed switch 1 is detected by control device 4.

Breaker B4 is connected between the other terminal 1b of high speed switch 1 and a primary winding 2a of transformer 2. When the power conversion device is used, breaker B4 is turned on. When the power conversion device undergoes maintenance, breaker B4 is turned off. Transformer 2 has a secondary winding 2b connected to an AC terminal 3a of bidirectional converter 3. Transformer 2 transmits and receives AC power between the other terminal 1b of high speed switch 1 and AC terminal 3a of bidirectional converter 3. An instantaneous value of AC voltage VAC appearing at AC terminal 3a of bidirectional converter 3 is detected by control device 4.

Bidirectional converter 3 has a DC terminal 3b connected to DC terminal T3. Bidirectional converter 3 is controlled by control device 4. When commercial AC power source 5 is sound, bidirectional converter 3 receives AC power from commercial AC power source 5 via breaker B2, high speed switch 1, breaker B4 and transformer 2, converts the received AC power into DC power, and stores the DC power in battery 7. When commercial AC power source 5 fails, bidirectional converter 3 converts DC power of battery 7 into AC power of the commercial frequency, and supplies the AC power to load 6 via transformer 2 and breakers B4 and B3.

Control device 4 controls high speed switch 1 and bidirectional converter 3 based on AC voltages VI, VO and VAC and battery voltage VB. That is, control device 4 determines that commercial AC power source 5 is sound when AC voltage VI is higher than a lower limit value, and control device 4 determines that commercial AC power source 5 fails when AC voltage VI is lower than the lower limit value.

When commercial AC power source 5 is sound, control device 4 turns on high speed switch 1 and also controls bidirectional converter 3 in synchronization with AC voltage VI so that battery voltage VB equals reference voltage VBr. Once battery voltage VB has reached reference voltage VBr, control device 4 controls bidirectional converter 3 to convert battery voltage VB into AC voltage VAC of the commercial frequency.

When the phase of AC output voltage VAC of bidirectional converter 3 is advanced from the phase of AC voltage VI received from commercial AC power source 5, power flows from battery 7 to load 6 via bidirectional converter 3, and battery voltage VB decreases. When the phase of AC output voltage VAC is delayed from the phase of AC voltage VI, power flows from commercial AC power source 5 to battery 7 via bidirectional converter 3, and battery voltage VB increases. Control device 4 controls bidirectional converter 3 to adjust the phase of AC voltage VAC and maintain battery voltage VB at reference voltage VBr.

When commercial AC power source 5 fails, control device 4 turns off high speed switch 1 and also controls bidirectional converter 3 so that AC voltage VO equals reference voltage VOr. When commercial AC power source 5 recovers from a power failure state to a sound state, control device 4 controls bidirectional converter 3 to cause AC voltage VO match AC voltage VI in phase and frequency, and subsequently turns on high speed switch 1.

Hereinafter, an operation of the power conversion device will be described. When the power conversion device is used, breaker B1 is turned off and breakers B2 to B4 are turned on. When commercial AC power source 5 is sound, high speed switch 1 is turned on, and AC power from commercial AC power source 5 is supplied to load 6 via high speed switch 1 to drive load 6.

Further, AC power from commercial AC power source 5 is supplied to bidirectional converter 3 via high speed switch 1 and transformer 2, converted into DC power, and stored in battery 7. Once battery voltage VB has reached reference voltage VBr, the phase of AC output voltage VAC of bidirectional converter 3 is controlled to maintain battery voltage VB at reference voltage VBr, and bidirectional converter 3 is put into a standby state.

When commercial AC power source 5 has a power failure, high speed switch 1 is turned off, and AC power is supplied from bidirectional converter 3 in the standby state to load 6 via transformer 2. Insofar as battery 7 has DC power stored therein, load 6 can be continuously driven.

When commercial AC power source 5 recovers from a power failure state to a sound state, control device 4 controls bidirectional converter 3 to cause AC voltage VO to match AC voltage VI in phase and frequency, and subsequently turns on high speed switch 1. This can prevent a current from flowing between commercial AC power source 5 and bidirectional converter 3 when high speed switch 1 is turned on.

When the power conversion device undergoes maintenance, breaker B1 is turned on, breakers B2 to B4 are turned off, AC power is supplied from commercial AC power source 5 to load 6 via breaker B1, and load 6 is thus driven. Thus, high speed switch 1 and the like can be electrically disconnected from commercial AC power source 5, and high speed switch 1 and the like can undergo maintenance while load 6 is driven.

Figure 2:
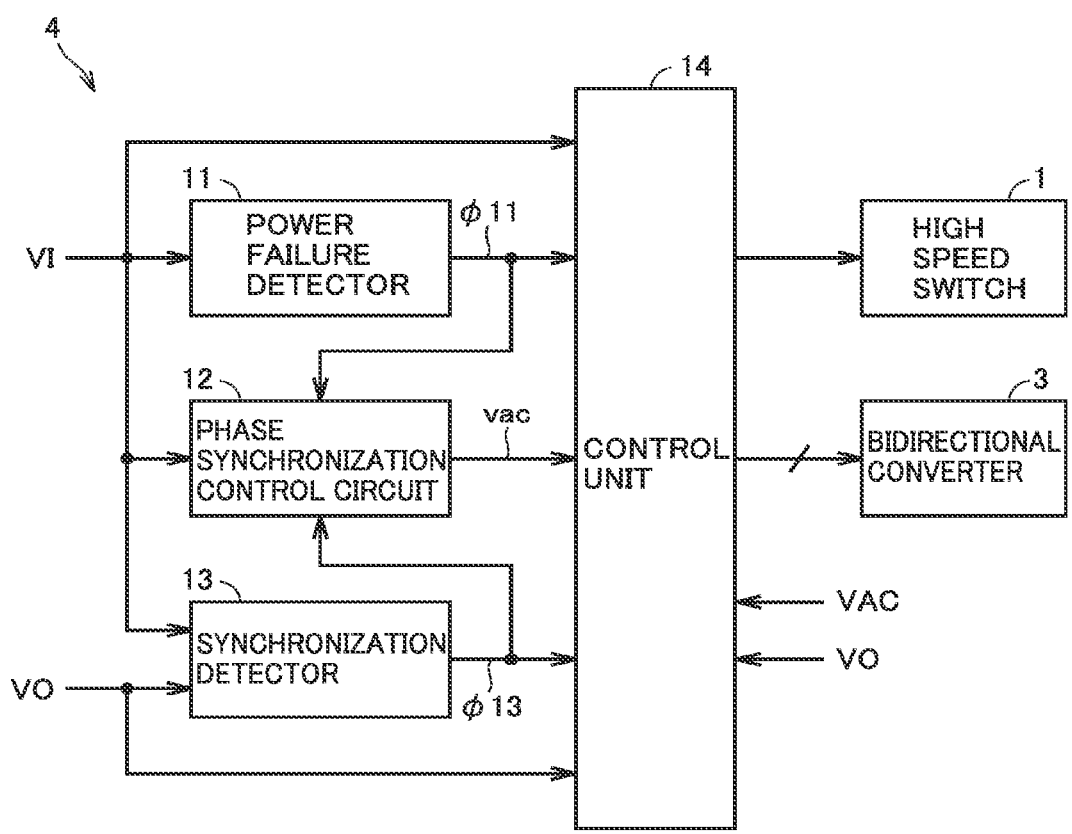
FIG. 2 is a block diagram showing a main part of a control device shown in FIG. 1.

FIG. 2 is a block diagram showing a main part of control device 4. In FIG. 2, control device 4 includes a power failure detector 11, a phase synchronization control circuit 12, a synchronization detector 13, and a control unit 14. Based on AC voltage VI supplied from commercial AC power source 5, power failure detector 11 detects whether commercial AC power source 5 has a power failure, and power failure detector 11 outputs to phase synchronization control circuit 12 and control unit 14 a power failure detection signal φ12 indicating a result of the detection.

When commercial AC power source 5 does not normally supply AC voltage VI, e.g., when AC voltage VI has an effective value lower than the lower limit value, power failure detector 11 determines that commercial AC power source 5 has a power failure, and power failure detector 11 sets a power failure detection signal φ11 to an active level or an "H" level.

When commercial AC power source 5 normally supplies AC voltage VI, e.g., when AC voltage VI has an effective value higher than the lower limit value, power failure detector 11 determines that commercial AC power source 5 is sound (or commercial AC power source 5 has recovered from a power failure state to a sound state), and power failure detector 11 sets power failure detection signal φ11 to an inactive level or an "L" level.

Phase synchronization control circuit 12 generates a sinusoidal AC signal vac based on power failure detection signal φ11, a synchronization detection signal φ13, and AC voltage VI supplied from commercial AC power source 5. When commercial AC power source 5 is sound (or when power failure detection signal φ11 is at the "L" level), phase synchronization control circuit 12 outputs AC signal vac with the same frequency (that is, a commercial frequency fi) in the same phase as AC voltage VI received from commercial AC power source 5.

When commercial AC power source 5 fails (or when power failure detection signal φ11 goes to the "H" level), phase synchronization control circuit 12 continues to output AC signal vac with the same frequency in the same phase as before commercial AC power source 5 fails.

When commercial AC power source 5 recovers from a power failure state to a sound state (that is, when power failure detection signal φ11 changes from the "H" level to the "L" level), phase synchronization control circuit 12 controls AC signal vac in frequency to eliminate the phase difference between AC voltage VI and AC signal vac to cause AC signal vac to match AC voltage VI in frequency and phase. AC signal vac is supplied to control unit 14. Phase synchronization control circuit 12 will be described in detail later.

Synchronization detector 13 detects whether AC voltage VI appearing at one terminal of high speed switch 1 and AC voltage VO appearing at the other terminal of high speed switch 1 match in frequency and phase, and synchronization detector 13 outputs to control unit 14 synchronization detection signal φ13 indicating a result of the detection.

When AC voltages VI and VO match in frequency and phase, synchronization detection signal φ13 is set to the active level or the "H" level. When AC voltages VI and VO do not match in frequency and phase, synchronization detection signal φ13 is set to the inactive level or the "L" level.

Control unit 14 controls high speed switch 1 and bidirectional converter 3 based on power failure detection signal φ11, AC signal vac, synchronization detection signal φ13, AC voltages VI, VO and VAC, and DC voltage VB.

When commercial AC power source 5 is sound (or when power failure detection signal φ11 is at the "L" level), control unit 14 turns on high speed switch 1 and also controls bidirectional converter 3 so that DC voltage VB equals reference voltage VBr. When doing so, control unit 14 controls bidirectional converter 3 to adjust the phase of AC voltage VAC and maintain battery voltage VB at reference voltage VBr.

When commercial AC power source 5 fails (or when power failure detection signal φ11 goes to the "H" level), control unit 14 turns off high speed switch 1 and also controls bidirectional converter 3 to output AC voltage VO with the same frequency in the same phase as AC signal vac. When AC voltage VO is thus output, AC voltage VO has frequency and phase maintained in a state that AC voltage VO had before commercial AC power source 5 fails.

When commercial AC power source 5 recovers from a power failure state to a sound state (that is, when power failure detection signal φ11 changes from the "H" level to the "L" level), control unit 14 first controls bidirectional converter 3 to output AC voltage VO with the same frequency in the same phase as AC signal vac. When AC voltage VO is thus output, AC signal vac is controlled by phase synchronization control circuit 12 to be the same as AC voltage VI in phase and frequency.

When AC signal vac matches AC voltage VI in phase and frequency, AC voltage VO matches AC voltage VI in phase and frequency, and synchronization detection signal φ13 is pulled from the "L" level to the "H" level.

When synchronization detection signal φ13 is pulled to the "H" level, control unit 14 turns on high speed switch 1. Furthermore, control unit 14 controls bidirectional converter 3 so that DC voltage VB equals reference voltage VBr. When doing so, control unit 14 controls bidirectional converter 3 to adjust the phase of AC voltage VAC and maintain battery voltage VB at reference voltage VBr.

Figure 3:
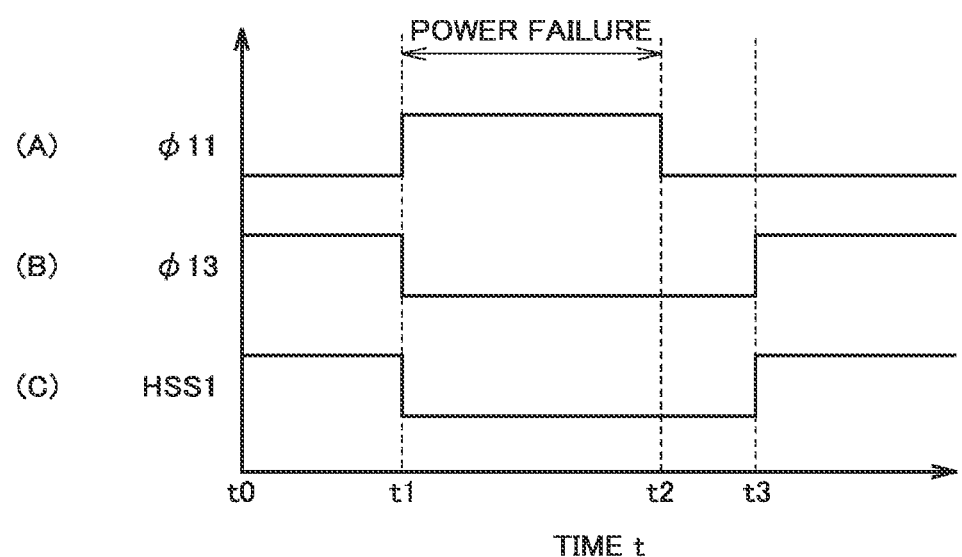
FIG. 3 is timing plots representing an operation of the control device shown in FIG. 2.

FIG. 3 is timing plots representing an operation of control device 4. In FIG. 3, a timing plot (A) represents power failure detection signal φ11 in waveform, a timing plot (B) represents synchronization detection signal φ13 in waveform, and a timing plot (C) represents a state of high speed switch (HSS) 1.

In an initial state (or at a time t0), it is assumed that commercial AC power source 5 (FIG. 1) is sound, power failure detection signal φ11 is set to the inactive level or the "L" level, synchronization detection signal φ13 is set to the active level or the "H" level, and high speed switch (HSS) 1 is turned on.

As power failure detection signal φ11 is at the "L" level, phase synchronization control circuit 12 generates AC signal vac with the same frequency in the same phase as AC voltage VI supplied from commercial AC power source 5.

At a time t1, commercial AC power source 5 fails, and in response, power failure detection signal φ11 is pulled to the active level or the "H" level, synchronization detection signal φ13 is set to the inactive level or the "L" level, and high-speed switch (HSS) 1 is turned off. At the same time, AC voltage VO is supplied from bidirectional converter 3 (FIG. 1) to load 6 via transformer 2 to continue to drive load 6.

As power failure detection signal φ11 is at the "H" level, phase synchronization control circuit 12 generates AC signal vac with the same frequency in the same phase as AC voltage VI had before commercial AC power source 5 fails. Control unit 14 controls bidirectional converter 3 to generate AC voltage VO with the same frequency in the same phase as AC signal vac.

At a time t2, commercial AC power source 5 recovers from the power failure state to a sound state, and in response, power failure detection signal φ11 is pulled to the inactive level or the "L" level. Normally, the phase of AC voltage VI before a power failure occurs and that of AC voltage VI after recovery from the power failure are different, and at the time t2, the phase of AC signal vac and that of AC voltage VI are different.

When power failure detection signal φ11 is set to the "L" level, phase synchronization control circuit 12 controls AC signal vac in frequency to cause AC signal vac to match AC voltage VI in phase and frequency. Control unit 14 controls bidirectional converter 3 to generate AC voltage VO with the same frequency in the same phase as AC signal vac.

At a time t3, AC voltage VI and AC voltage VO match in phase and frequency, and in response, synchronization detection signal φ13 is pulled from the inactive level or the "L" level to the active level or the "H" level, and high speed switch 1 is turned on. Thus, AC power is supplied from commercial AC power source 5 to load 6 via high speed switch 1 to drive load 6.

Thus, at times t2 to t3, AC signal vac is controlled in frequency so that AC signal vac matches AC voltage VI in phase and frequency, and AC voltage VO matches AC signal vac in phase and frequency.

When AC voltage VO significantly varies in frequency, it may have a negative effect on load 6 (FIG. 1), and accordingly, it is necessary to suppress AC signal vac's frequency variation to be small. Further, at times t2 to t3 the DC power of battery 7 is converted into AC power by bidirectional converter 3 and supplied to load 6, and in order to suppress consumption of the DC power of battery 7 to be small, it is necessary to cause AC signal vac to quickly match AC voltage VI in phase and frequency. The first embodiment will address this issue.

FIG. 4 is a vector representation for illustrating the principle of the first embodiment. In FIG. 4, a vector representation (A) represents a case where the phase of AC voltage VI is advanced relative to AC signal vac, a vector representation (B) represents a case where the phase of AC voltage VI matches the phase of AC signal vac, and a vector representation (C) represents a case where the phase of AC voltage VI is delayed relative to AC signal vac. In FIG. 4, a vector representing AC signal vac in a rotating coordinate system is used as a reference, and a vector representing AC voltage VI rotates about the origin. The vector representing AC voltage VI rotates at an angular velocity of a value corresponding to a difference fi−fo between frequency fi of AC voltage VI and frequency fo of AC signal vac.

As shown in FIG. 4(A), when the phase of AC voltage VI is advanced from the phase of AC signal vac, frequency fo of AC signal vac is increased to be higher than frequency fi of AC voltage VI. As a result, a phase difference Δθ between AC voltage VI and AC signal vac gradually decreases, and as shown in FIG. 4(B), the vector representing AC signal vac catches up with the vector representing AC voltage VI, and phase difference Δθ is zeroed (in degrees).

Ideally, it is desirable that a frequency difference between AC voltage VI and AC signal vac, i.e., Δf=fi−fo, is also zeroed when phase difference Δθ is zeroed (in degrees). In reality, however, zeroing phase difference Δθ requires frequency fo of AC signal vac to be higher than frequency fi of AC voltage VI, and, as shown in FIG. 4(C), the vector representing AC signal vac would pass the vector representing AC voltage VI, and phase difference Δθ would overshoot and have a negative value.

As shown in FIG. 4(C), when the phase of AC voltage VI is delayed from AC signal vac, frequency fo of AC signal vac is lowered to be lower than frequency fi of AC voltage VI. This gradually decreases phase difference Δθ between AC voltage VI and AC signal vac, and, as shown in FIG. 4(B), the vector representing AC voltage VI catches up with the vector representing AC signal vac and phase difference Δθ is zeroed (in degrees).

In this case as well, it is desirable that the frequency difference between AC voltage VI and AC signal vac, i.e., Δf=fi−fo, is also zeroed when phase difference Δθ is zeroed. In reality, however, zeroing phase difference Δθ requires frequency fo of AC signal vac to be lower than frequency fi of AC voltage VI, and, as shown in FIG. 4(A), the vector representing AC voltage VI would pass the vector representing AC signal vac, and phase difference Δθ would overshoot and have a positive value. In this way, frequency fo and the phase of AC signal vac are caused to match frequency fi and the phase of AC voltage VI while phase difference Δθ repeats overshooting.

Accordingly, in the first embodiment, in response to phase difference Δθ decreasing, frequency fo of AC signal vac is changed in a reduced width to suppress overshooting of phase difference Δθ to be small. This suppresses variation in frequency of AC signal vac to be small and allows AC signal vac to be quickly synchronized with AC voltage VI.

Figure 5:
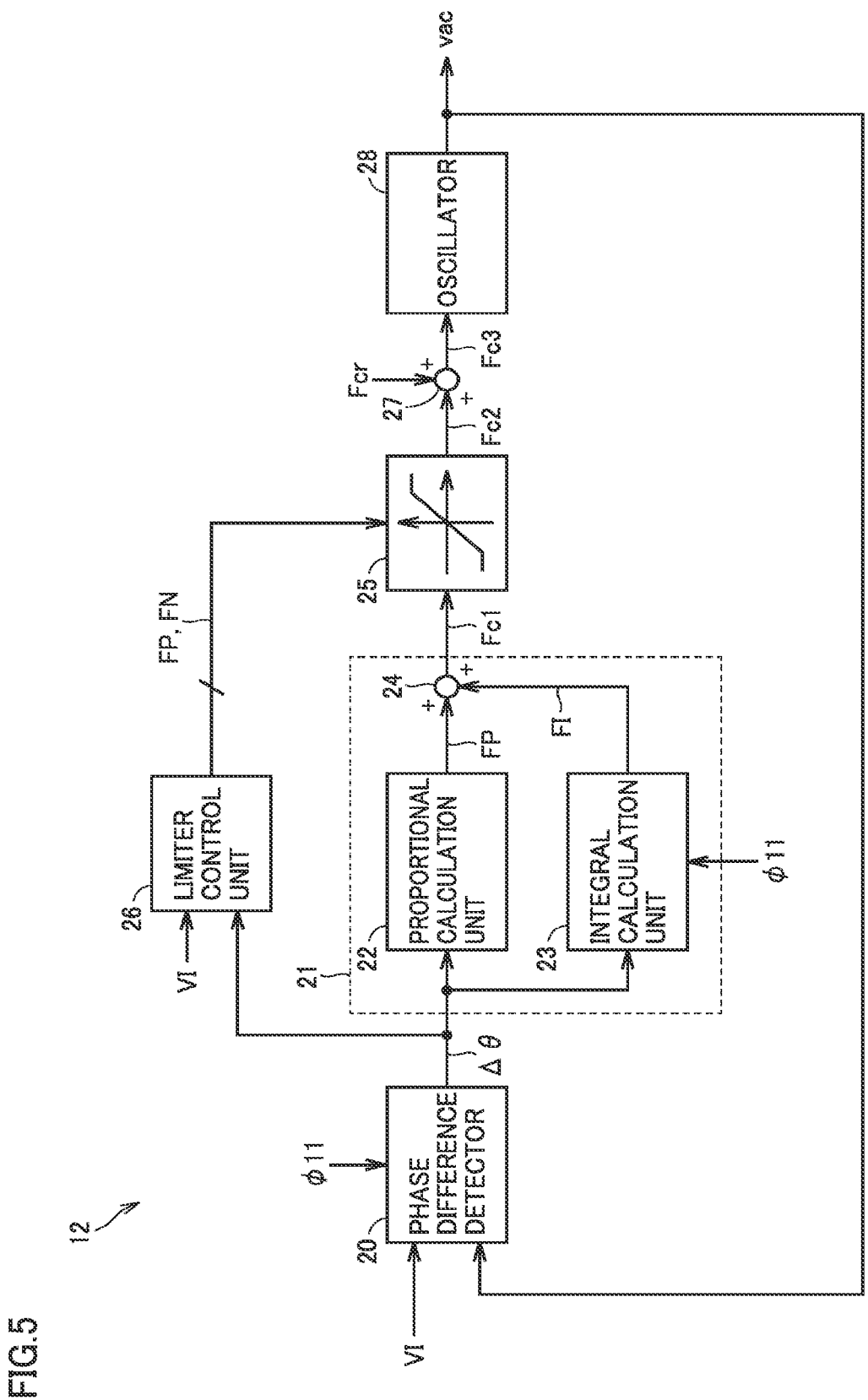
FIG. 5 is a block diagram showing a configuration of a phase synchronization control circuit shown in FIG. 2.

FIG. 5 is a circuit block diagram showing a configuration of phase synchronization control circuit 12. In FIG. 5, phase synchronization control circuit 12 includes a phase difference detector 20, a frequency control unit 21, a frequency limiter 25, a limiter control unit 26, an adder 27, and an oscillator 28.

Phase difference detector 20 is activated when power failure detection signal ϕ11 is at the inactive level or the "L" level, and phase difference detector 20 detects phase difference Δθ between AC voltage VI (a first AC signal) supplied from commercial AC power source 5 and AC signal vac (a second AC signal) output from oscillator 28. A difference between a phase angle θ1 of AC voltage VI and a phase angle θ2 of AC signal vac provides phase difference Δθ=Δθ1−θ2.

When power failure detection signal ϕ11 is at the active level or the "H" level, AC voltage VI will be 0 V, for example, and phase difference detector 20 sets a detection value of phase difference Δθ to 0 without detecting any actual phase difference Δθ.

Frequency control unit 21 generates a frequency control value Fc1 (a first frequency control value) to zero phase difference Δθ. Frequency control unit 21 includes a proportional calculation unit 22, an integral calculation unit 23, and an adder 24. Proportional calculation unit 22 calculates a frequency control value FP, which is obtained by multiplying phase difference Δθ by a proportional gain.

Integral calculation unit 23 is activated when power failure detection signal ϕ11 is at the inactive level or the "L" level, and integral calculation unit 23 calculates a frequency control value FI, which is obtained by multiplying an integral of phase difference Δθ by an integral gain.

When power failure detection signal ϕ11 is pulled from the "L" level to the "H" level (that is, when commercial AC power source 5 fails), integral calculation unit 23 holds and outputs frequency control value FI of a value that frequency control value FI had before power failure detection signal ϕ11 is set to the "H" level (that is, before commercial AC power source 5 fails). Adder 24 adds frequency control value FP and frequency control value FI together to obtain frequency control value Fc1.

Frequency limiter 25 limits frequency control value Fc1 that is generated by frequency control unit 21 to fall within a variable limit range to generate a frequency control value Fc2 (a second frequency control value). Frequency limiter 25 receives a positive limit value FP and a negative limit value FN from limiter control unit 26. The variable limit range is a range between positive limit value FP and negative limit value FN. The variable limit range has a width W1, which is a difference between positive limit value FP and negative limit value FN (i.e., FP−FN).

Figure 6:
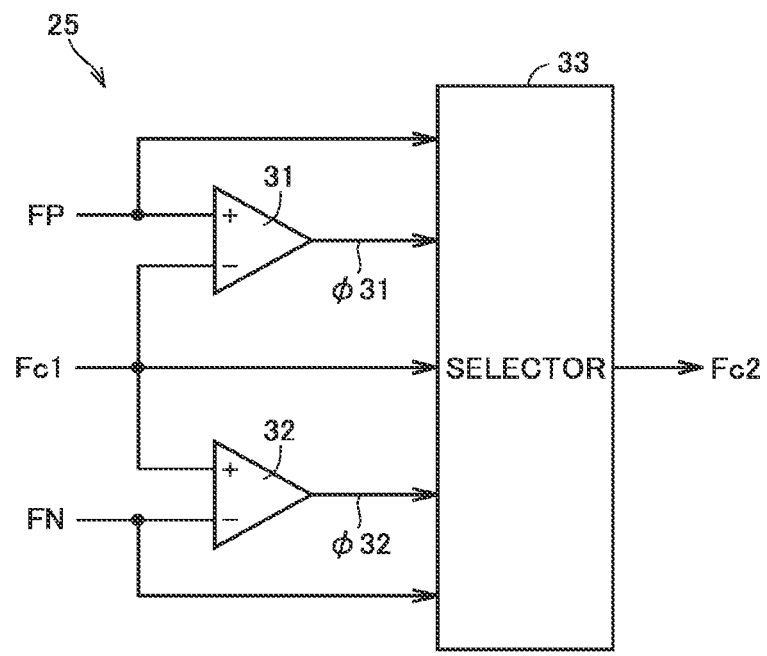
FIG. 6 is a block diagram showing a configuration of a frequency limiter shown in FIG. 5.

FIG. 6 is a circuit block diagram showing a configuration of frequency limiter 25. In FIG. 6, frequency limiter 25 includes comparators 31 and 32 and a selector 33. Comparator 31 compares frequency control value Fc1 with positive limit value FP in level, and outputs a signal ϕ31 indicating a result of the comparison. When Fc1≤FP, signal ϕ31 is set to the "H" level. When Fc1>FP, signal ϕ31 is set to the "L" level.

Comparator 32 compares frequency control value Fc1 with negative limit value FN in level, and outputs a signal ϕ32 indicating a result of the comparison. When Fc1≥FN, signal ϕ32 is set to the "H" level. When Fc1<FN, signal ϕ32 is set to the "L" level.

Selector 33 selects one of positive limit value FP, frequency control value Fc1, and negative limit value FN based on signals ϕ31 and ϕ32, and outputs the selected value as frequency control value Fc2. That is, when signals ϕ31 and ϕ32 are both at the "H" level, selector 33 selects and outputs frequency control value Fc1 as frequency control value Fc2.

When signals ϕ31 and ϕ32 are at the "L" level and the "H" level, respectively, selector 33 selects and outputs positive limit value FP as frequency control value Fc2. When signals ϕ31 and ϕ32 are at the "H" level and the "L" level, respectively, selector 33 selects and outputs negative limit value FN as frequency control value Fc2.

Figure 7:
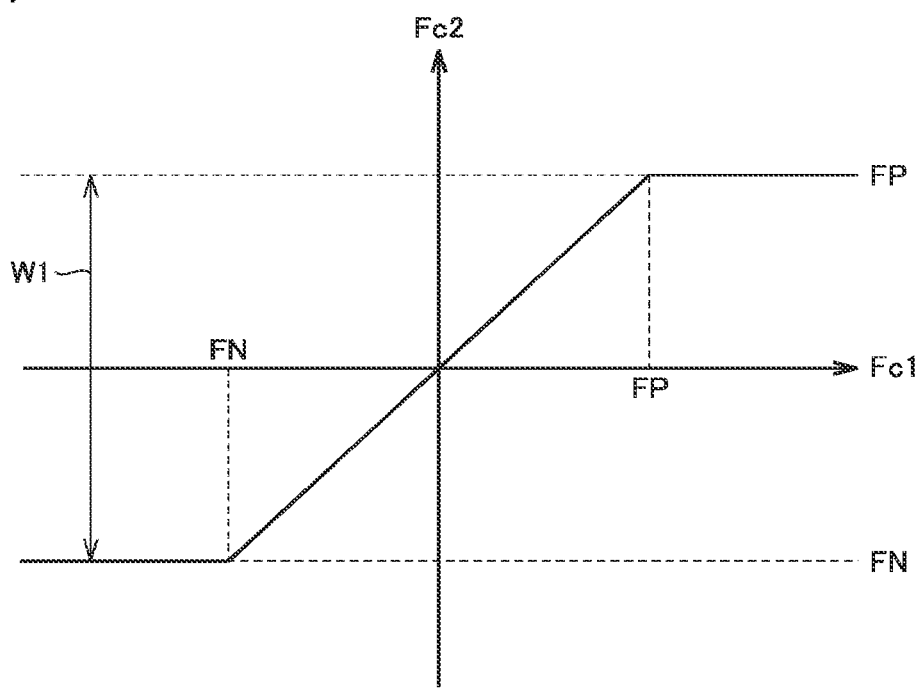
FIG. 7 is a diagram representing an operation of the frequency limiter shown in FIG. 6.

FIG. 7 is a diagram representing an operation of frequency limiter 25. In FIG. 7, the axis of abscissas represents frequency control value Fc1, and the axis of ordinates represents frequency control value Fc2. In FIG. 7, when FN≤Fc1≤FP, Fc2=Fc1. When Fc1>FP, Fc2=FP. When Fc1<FN, Fc2=FN. The variable limit range's width W1=FP−FN is controlled by limiter control unit 26.

Referring again to FIG. 5, limiter control unit 26 generates positive limit value FP and negative limit value FN based on phase difference Δθ detected by phase difference detector 20 and AC voltage VI supplied from commercial AC power source 5, and provides the values to frequency limiter 25. Limiter control unit 26 reduces the variable limit range's width W1=FP−FN in response to phase difference Δθ decreasing.

Figure 8:
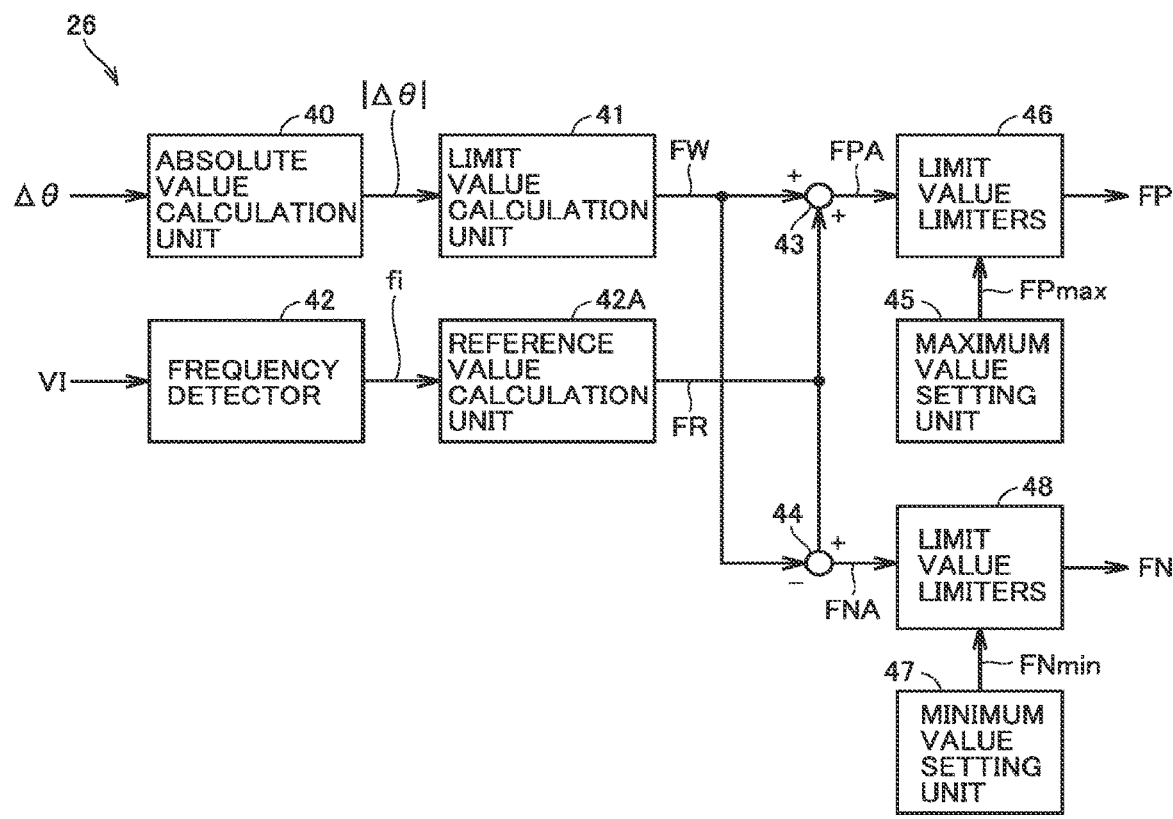
FIG. 8 is a block diagram showing a configuration of a limiter control unit shown in FIG. 5.

FIG. 8 is a block diagram showing a configuration of limiter control unit 26. In FIG. 8, limiter control unit 26 includes an absolute value calculation unit 40, a limit value calculation unit 41, a frequency detector 42, a reference value calculation unit 42A, an adder 43, a subtractor 44, a maximum value setting unit 45, limit value limiters 46 and 48, and a minimum value setting unit 47.

Absolute value calculation unit 40 determines an absolute value |Δθ| of phase difference Δθ detected by phase difference detector 20 (FIG. 5). Limit value calculation unit 41 calculates a limit value FW based on absolute value |Δθ| of the phase difference, and decreases limit value FW in response to the phase difference's absolute value |Δθ| decreasing.

Figure 9:
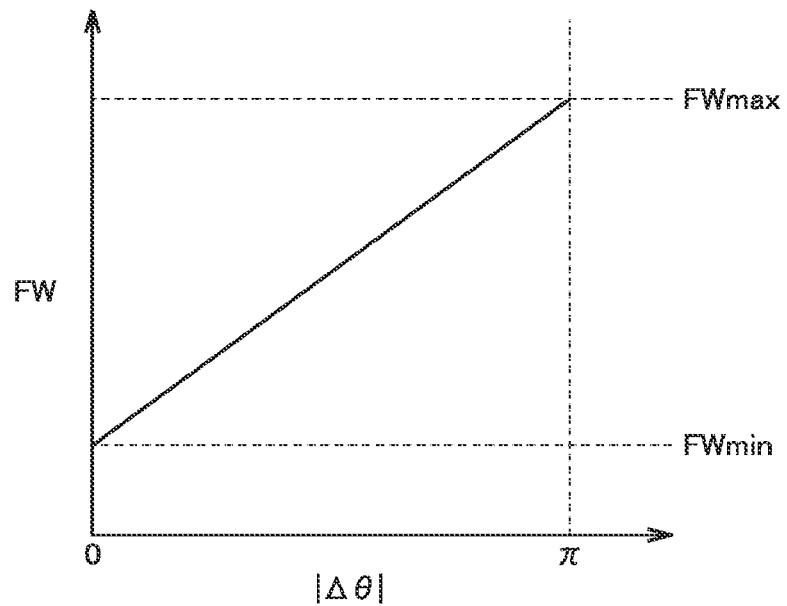
FIG. 9 is a diagram representing an operation of a control value calculation unit shown in FIG. 8.

FIG. 9 is a diagram representing an operation of limit value calculation unit 41. In FIG. 9, the axis of abscissas represents absolute value |Δθ| of the phase difference, and the axis of ordinates represents limit value FW. As shown in FIG. 9, when absolute value |Δθ| of the phase difference increases, limit value FW increases from a minimum value FWmin to a maximum value FWmax in proportion to absolute value |Δθ| of the phase difference. In other words, when absolute value |Δθ| of the phase difference decreases, limit value FW decreases from maximum value FWmax to minimum value FWmin in proportion to absolute value |Δθ| of the phase difference.

Note that minimum value FWmin is set to a predetermined value larger than 0. This is because when minimum value FWmin is set to 0, phase difference Δθ between AC voltage VI and AC signal vac cannot be zeroed.

Referring again to FIG. 8, frequency detector 42 detects frequency fi of AC voltage VI supplied from commercial AC power source 5. Reference value calculation unit 42A calculates a difference between frequency fi of AC voltage VI detected by frequency detector 42 and a rated value fcr for the commercial frequency, i.e., $\Delta fi=fi-fcr$, and determines a reference value FR of a value corresponding to difference $\Delta fi$.

For example, when oscillator 28 is a voltage controlled oscillator, reference value FR is a voltage value. For example, when fi and fcr are both 60 Hz, $\Delta fi$ will be 0 Hz, and FR will be a voltage value indicating 0 Hz. In this case, as will be described hereinafter, oscillator 28 will output AC signal vac with frequency $\Delta fi=0$ Hz plus rated value fcr, that is, $fo=\Delta fi+fcr$.

Adder 43 adds reference value FR and limit value FW together to generate a positive limit value FPA=FR+FW. Subtractor 44 subtracts limit value FW from reference value FR to generate a negative limit value FNA=FR−FW.

Maximum value setting unit 45 sets a maximum value FPmax for positive limit value FP. Maximum value FPmax is a voltage value indicating a value obtained by subtracting rated value fcr for the commercial frequency from a maximum frequency fmax that oscillator 28 can output, i.e., fmax−fcr. Limit value limiter 46 limits positive limit value FPA to maximum value FPmax or less to generate positive limit value FP. Positive limit value FP is provided to frequency limiter 25 (FIG. 5).

Minimum value setting unit 47 sets a minimum value FNmin for negative limit value FN. Minimum value FNmin is a voltage value indicating a value obtained by subtracting rated value fcr for the commercial frequency from a minimum frequency fmin that oscillator 28 can output, i.e., fmin−fcr. Limit value limiter 48 limits negative limit value FNA to minimum value FNmin or more to generate negative limit value FN. Negative limit value FN is provided to frequency limiter 25 (FIG. 5).

Figure 10:
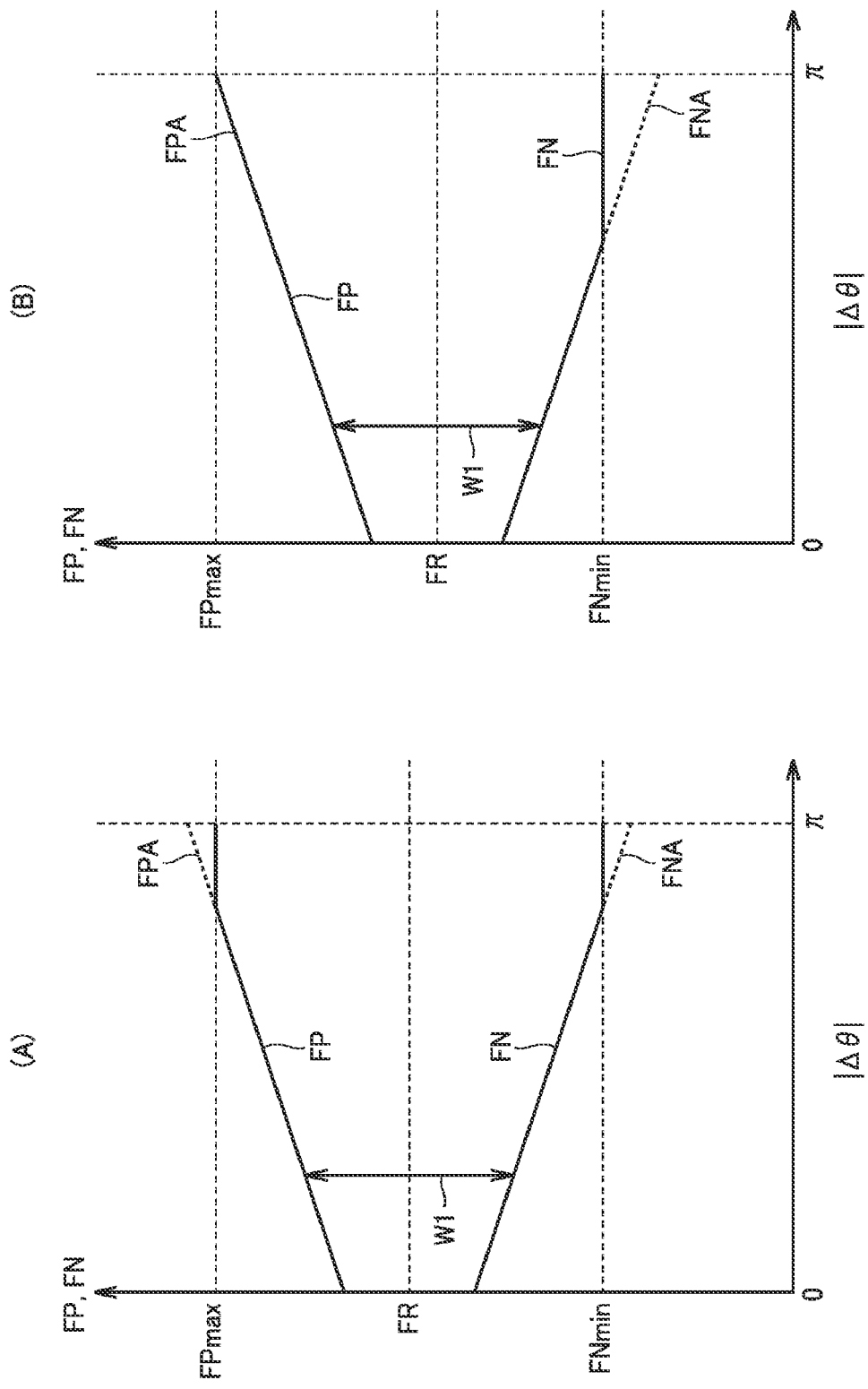
FIG. 10 is a diagram representing an operation of the limiter control unit shown in FIG. 8.

FIG. 10 is a diagram representing an operation of limiter control unit 26. In FIG. 10, (A) represents a case where frequency fi of AC voltage VI is rated value fcr for the commercial frequency, that is, fi=fcr, and (B) represents a case where frequency fi of AC voltage VI is lower than rated value fcr for the commercial frequency, that is, fi<fcr.

In FIGS. 10(A) and 10(B), it is assumed that frequency fi of AC voltage VI is constant regardless of absolute value $|\Delta\theta|$ of the phase difference. Frequency fi of AC voltage VI corresponds to reference value FR. When absolute value $|\Delta\theta|$ of the phase difference increases, positive limit value FPA increases and negative limit value FNA decreases.

When positive limit value FPA is equal to or smaller than maximum value FPmax, positive limit value FPA will serve as positive limit value FP, whereas when positive limit value FPA is higher than maximum value FPmax, maximum value FPmax will serve as positive limit value FP.

When negative limit value FNA is equal to or larger than minimum value Fmin, negative limit value FNA will serve as negative limit value FN, whereas when negative limit value FNA is lower than minimum value FNmin, minimum value FNmin will serve as negative limit value FN. It should be noted that FPA may be smaller than FPmax and FNA may be larger than FNmin, regardless of absolute value $|\Delta\theta|$ of the phase difference. In this case, FP=FPA and FN=FNA.

As shown in FIG. 10(A), when fi=fcr, a curve representing positive limit value FP and a curve representing negative limit value FN are symmetrical with reference to a center line, which is a straight line representing reference value FR. Further, as shown in FIG. 10(B), when fi<fcr, $|\Delta\theta|$ for which negative limit value FN will be minimum value FNmin will be smaller than $|\Delta\theta|$ for which positive limit value FP will be maximum value FPmax. Therefore, when fi<fcr, the curve representing positive limit value FP and the curve representing negative limit value FN will not be symmetrical with reference to the center line that is the straight line representing reference value FR.

Further, although not shown, when fi>fcr, $|\Delta\theta|$ for which positive limit value FP will be maximum value FPmax will be smaller than $|\Delta\theta|$ for which negative limit value FN will be minimum value FNmin. Therefore, when fi>fcr, the curve representing positive limit value FP and the curve representing negative limit value FN will not be symmetrical with reference to the center line that is the straight line representing reference value FR.

Referring again to FIG. 5, adder 27 adds a voltage value Fcr representing rated value fcr for the commercial frequency to frequency control value Fc2 generated by frequency limiter 25 to generate a frequency command value Fc3. Oscillator 28 outputs AC signal vac having frequency fo of a value corresponding to frequency command value Fc3. Adder 27 and oscillator 28 constitute one embodiment of an AC signal generation unit that generates AC signal vac having frequency fo of a value corresponding to frequency control value Fc2. AC signal vac is provided to control unit 14 (FIG. 2) and also fed back to phase difference detector 20.

Hereinafter, an operation of phase synchronization control circuit 12 will be described. When power failure detection signal $\phi$11 is at the inactive level or the "L" level (that is, when commercial AC power source 5 is sound), phase difference detector 20 (FIG. 5) and integral calculation unit 23 are activated.

Phase difference detector 20 detects phase difference $\Delta\theta$ between AC voltage VI supplied from commercial AC power source 5 and AC signal vac generated by oscillator 28, and the detected value is provided to proportional calculation unit 22, integral calculation unit 23, and limiter control unit 26.

Proportional calculation unit 22 generates frequency control value FP having a value corresponding to phase difference $\Delta\theta$, integral calculation unit 23 generates frequency control value FI having a value corresponding to phase difference $\Delta\theta$, and adder 24 adds frequency control value FP and frequency control value FI together to generate frequency control value Fc1.

In limiter control unit 26, absolute value calculation unit 40 (FIG. 8) determines absolute value $|\Delta\theta|$ of the phase difference, and limit value calculation unit 41 determines limit value FW of a value corresponding to absolute value $|\Delta\theta|$. Further, frequency detector 42 detects frequency fi of AC voltage VI, and reference value calculation unit 42A determines reference value FR that is a voltage value representing a difference between frequency fi of AC voltage VI and rated value fcr for the commercial frequency, i.e., $\Delta fi=fi-fcr$.

Adder 43 generates positive limit value FPA=FR+FW, and subtractor 44 generates negative limit value FNA=FR−FW. Positive limit value FPA is limited to maximum value FPmax or less by limit value limiter 46 and will thus be positive limit value FP. Negative limit value FNA is limited to minimum value FNmin or more by limit value limiter 48 and will thus be negative limit value FN.

Positive limit value FP is provided to comparator 31 (FIG. 6) and selector 33 of frequency limiter 25. Negative limit value FN is provided to comparator 32 and selector 33 of frequency limiter 25. Frequency control value Fc1 is provided to comparators 31 and 32 and selector 33 of frequency limiter 25.

Comparator 31 compares frequency control value Fc1 with positive limit value FP in level and comparator 32 compares frequency control value Fc1 with negative limit value FN in level, and selector 33 selects one of frequency control value Fc1, positive limit value FP, and negative limit value FN based on a result of the comparisons, and outputs the selected value as frequency control value Fc2.

When FN≤Fc1≤FP, Fc2=Fc1. When Fc1>FP, Fc2=FP. When Fc1<FN, Fc2=FN. Adder 27 (FIG. 5) adds voltage value Fcr representing rated value fcr for the commercial frequency to frequency control value Fc2 to generate frequency command value Fc3, and oscillator 28 generates AC signal vac of a frequency of a value corresponding to frequency command value Fc3. AC signal vac is fed back to phase difference detector 20.

When commercial AC power source 5 is sound, AC signal vac's phase and frequency fo match AC voltage VI's phase and frequency fi, phase difference Δθ is 0, and the variable limit range has width W1 (FIG. 10) set to a minimum value (2×FWmin) by limiter control unit 26. When frequency fi of AC voltage VI is rated value fcr for the commercial frequency, frequency command value Fc3 is set to voltage value Fcr representing rated value fcr, and frequency fo of AC signal vac is also set to rated value fcr.

When commercial AC power source 5 fails, power failure detection signal ϕ11 is pulled from the inactive level or the "L" level to the active level or the "H" level, phase difference detector 20 outputs a signal indicating that phase difference Δθ is 0, and integral calculation unit 23 holds and outputs frequency control value FI of a value that frequency control value FI had before a power failure occurs.

For example, when frequency fi of AC voltage VI before a power failure occurs is lower than rated value fcr by 1 Hz, frequency control value FI will be a value indicating −1 Hz. Thus, when commercial AC power source 5 fails, oscillator 28 outputs AC signal vac having a phase and frequency fo that AC signal vac had before commercial AC power source 5 fails.

Subsequently, when commercial AC power source 5 recovers from the power failure state to the sound state and power failure detection signal ϕ11 falls from the active level or the "H" level to the inactive level or the "L" level, phase difference detector 20 and integral calculation unit 23 are activated. Then, it is assumed that phase difference Δθ between AC voltage VI and AC signal vac has a large value (e.g., π/2).

In that case, phase difference detector 20 detects the large phase difference Δθ, proportional calculation unit 22 and integral calculation unit 23 generate large frequency control values FP and FI, and a large frequency control value Fc1 is generated. Further, limit value calculation unit 41 (FIG. 8) generates a large limit value FW, and the variable limit range of frequency limiter 25 is set to a large width W1.

As the variable limit range of frequency limiter 25 has the large width W1, the large frequency control value Fc1 passes through frequency limiter 25 and will serve as frequency control value Fc2, frequency fo of AC signal vac increases, and phase difference Δθ between AC voltage VI and AC signal vac decreases.

As phase difference Δθ decreases, frequency control unit 21 reduces frequency control value Fc1. Further, limit value calculation unit 41 (FIG. 8) reduces limit value FW, and the variable limit range of frequency limiter 25 is set to a small width W1.

As the variable limit range of frequency limiter 25 has the small width W1, frequency control value Fc1 is limited by frequency limiter 25 and thus will serve as frequency control value Fc2, frequency fo of AC signal vac decreases, phase difference Δθ between AC voltage VI and AC signal vac decreases, and overshooting of phase difference Δθ and frequency fo is suppressed (see FIG. 4).

Figure 11:
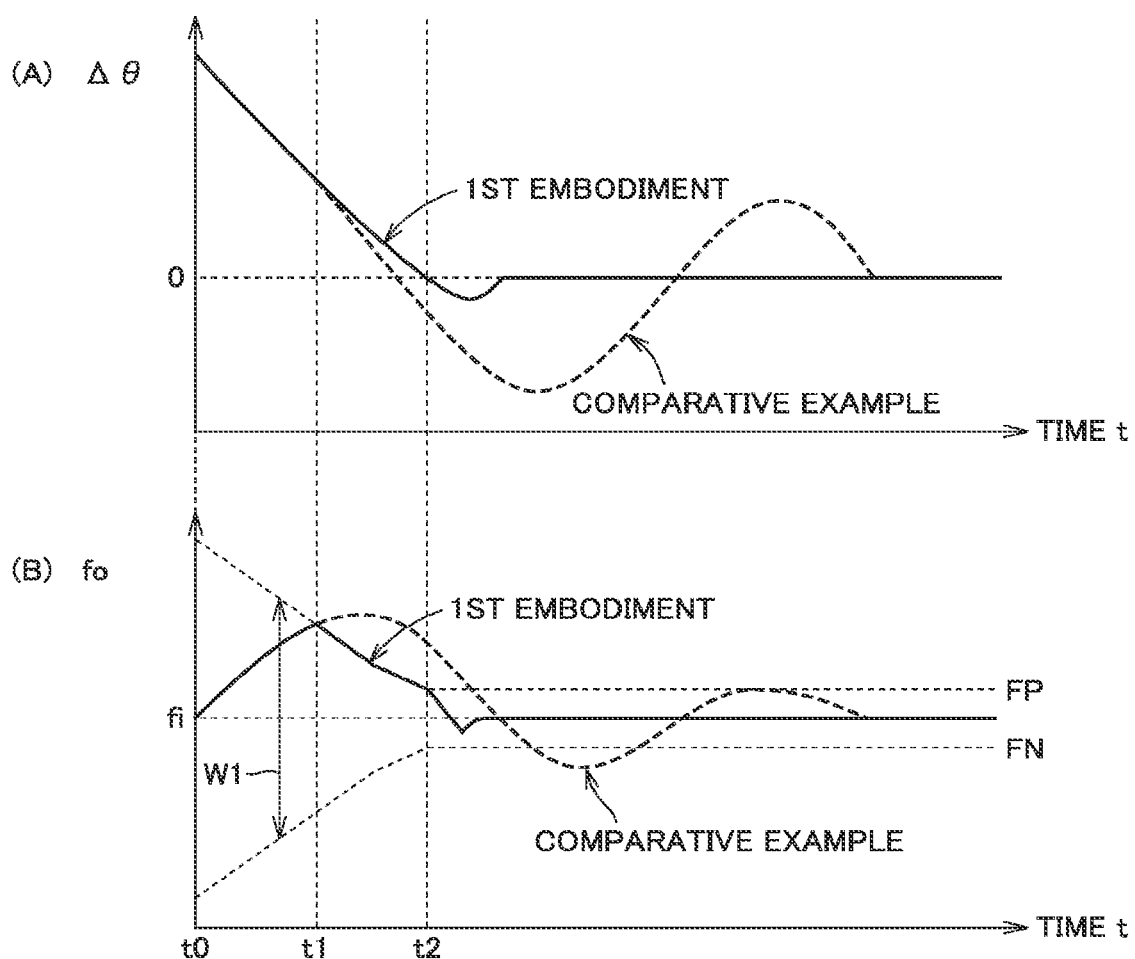
FIG. 11 is timing plots representing an operation of the phase synchronization control circuit shown in FIGS. 2 to 10 and that of a comparative example.

FIG. 11 is timing plots representing an operation of phase synchronization control circuit 12 and that of a comparative example. In FIG. 11, (A) represents phase difference Δθ between AC voltage VI and AC signal vac in waveform, and (B) represents frequency fo of AC signal vac and positive limit value FP and negative limit value FN of frequency limiter 25 in waveform. A difference between positive limit value FP and negative limit value FN is the width of the variable limit range of frequency limiter 25, or W1=FP−FN.

In FIG. 11, a solid line represents an operation of phase synchronization control circuit 12 according to the first embodiment, and a dotted line represents an operation of a phase synchronization control circuit serving as the comparative example. The phase synchronization control circuit of the comparative example is different from phase synchronization control circuit 12 of the first embodiment in that frequency limiter 25 and limiter control unit 26 are removed and frequency control value Fc1 is directly provided to adder 27.

An operation of phase synchronization control circuit 12 of the first embodiment will first be described. At time t0, it is assumed that commercial AC power source 5 recovers from a power failure state to a sound state and power failure detection signal ϕ11 falls from the active level or the "H" level to the inactive level or the "L" level. Then, it is assumed that frequency fi of AC voltage VI and frequency fo of AC signal vac match (i.e., fo=fi), the phase of AC voltage VI is advanced from the phase of AC signal vac, and phase difference Δθ has a positive value.

When power failure detection signal ϕ11 is set to the "L" level, phase difference detector 20 and integral calculation unit 23 (FIG. 5) are activated. As phase difference Δθ has a positive value, frequency control unit 21 increases frequency control value Fc1.

At this point in time, phase difference Δθ is large and the variable limit range of frequency limiter 25 has a large width W1=FP−FN, frequency control value Fc1 passes through frequency limiter 25 and thus will serve as frequency control value Fc2, and frequency fo of AC signal vac increases. As frequency fo of AC signal vac increases, phase difference Δθ between AC voltage VI and AC signal vac decreases, and limiter control unit 26 (FIG. 5) reduces width W1 of the variable limit range of frequency limiter 25.

At time t1, frequency fo of AC signal vac reaches positive limit value FP of frequency limiter 25, and frequency fo decreases with positive limit value FP. At time t2, phase difference Δθ reaches 0, and positive limit value FP reaches minimum value FWmin.

Then, fo>fi, and the vector representing AC signal vac would pass the vector representing AC voltage VI, and phase difference Δθ overshoots to a negative value. However, as a difference between frequency fo of AC signal vac and frequency fi of AC voltage VI has been reduced to minimum value FWmin of positive limit value FP, the overshooting of phase difference Δθ is suppressed to be small.

When phase difference Δθ overshoots to a negative value, frequency fo of AC signal vac decreases below frequency fi of AC voltage VI, and phase difference Δθ increases toward 0. As phase difference Δθ increases toward 0, frequency fo of AC signal vac increases toward frequency fi of AC voltage VI, and phase difference Δθ is zeroed and fo=fi. That is, the phase and frequency fo of AC signal vac match the phase and frequency fi of AC voltage VI.

In contrast, the comparative example does not have frequency limiter 25, and frequency fo of AC signal vac increases even after time t1, and frequency fo will have a value larger than positive limit value FP. As frequency fo has a value larger than positive limit value FP, phase difference $\Delta\theta$ reaches 0 earlier than in the first embodiment, and phase difference $\Delta\theta$ overshoots to a large negative value.

When phase difference $\Delta\theta$ overshoots to a large negative value, then, in order to bring phase difference $\Delta\theta$ back to 0, frequency fo of AC signal vac is significantly lowered and becomes lower than negative limit value FN. When phase difference $\Delta\theta$ is turned to increase, frequency fo of AC signal vac is also turned to increase. When phase difference $\Delta\theta$ passes 0 and overshoots to a positive value, then, in order to bring phase difference $\Delta\theta$ back to 0, frequency fo of AC signal vac is increased. When the comparative example is compared with the first embodiment, AC signal vac has large frequency variation, and it takes a long time to cause the phase and frequency fo of AC signal vac to match the phase and frequency fi of AC voltage VI.

Note that in PTL 1, when commercial AC power source 5 fails, frequency fo of AC signal vac is set to rated value fcr, and when commercial AC power source 5 recovers from the power failure state to the sound state, synchronization control is started after phase difference $\Delta\theta$ reaches 0, and a long period of time may be taken before the phase and frequency fo of AC signal vac are caused to match the phase and frequency fi of AC voltage VI.

As described above, in the first embodiment, width W1 of the variable limit range of frequency limiter 25 is reduced in response to phase difference $\Delta\theta$ between AC voltage VI and AC signal vac decreasing, and overshooting of frequency fo of AC signal vac can be suppressed to be small. This can suppress frequency variation of frequency fo of AC signal vac to be small, and allows the phase and frequency fo of AC signal vac to quickly match the phase and frequency fi of AC voltage VI.

Therefore, for a period of time elapsing since commercial AC power source 5 recovers from a power failure state to a sound state until high speed switch 1 is turned on, frequency variation of output voltage VO of the power conversion device can be suppressed to be small, and prevented from having a negative effect on load 6. Further, the period of time elapsing since commercial AC power source 5 recovers until high speed switch 1 is turned on can be reduced, and consumption of DC power of battery 7 can be reduced, which allows battery 7 to be reduced in size and cost.

Second Embodiment

As described in the first embodiment, for the period of time elapsing since commercial AC power source 5 recovers from a power failure state to a sound state until high speed switch 1 is turned on, AC voltage having the same frequency fo as AC signal vac generated by phase synchronization control circuit 12 is generated by bidirectional converter 3 and supplied to load 6 via transformer 2. Depending on the type of load 6 (for example, a motor), if frequency fo rapidly changes, load 6 may be negatively affected. A second embodiment will address this issue.

Figure 12:
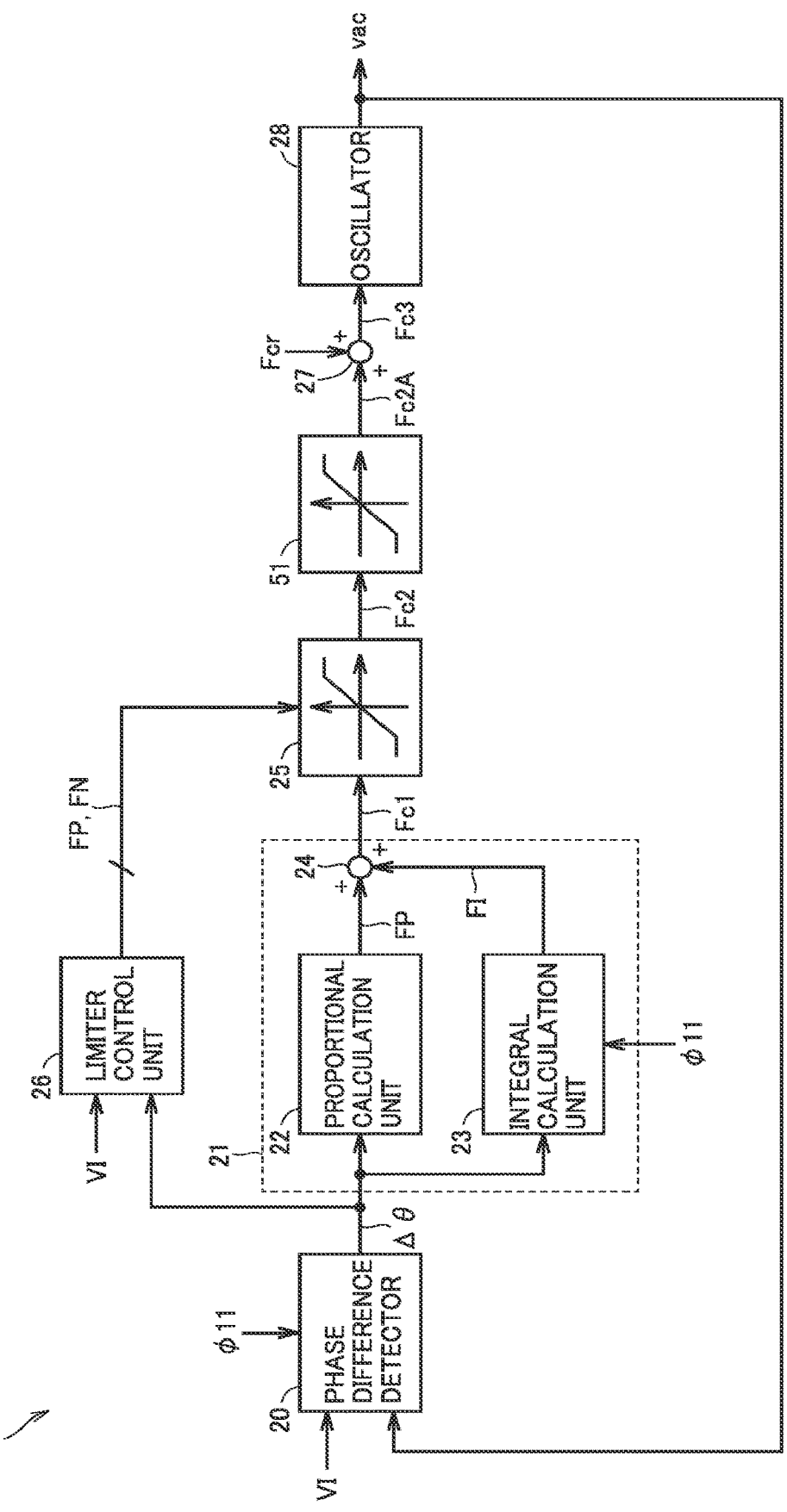
FIG. 12 is a block diagram showing a configuration of a phase synchronization control circuit that a power conversion device according to a second embodiment of the present disclosure comprises.

FIG. 12 is a block diagram showing a configuration of a phase synchronization control circuit 50 that a power conversion device according to the second embodiment of the present disclosure comprises, as compared with FIG. 5. In FIG. 12, phase synchronization control circuit 50 differs from phase synchronization control circuit 12 in that an amount-of-change limiter 51 is added between frequency limiter 25 and adder 27.

Amount-of-change limiter 51 limits an amount of change per unit time of frequency control value Fc2 that is generated by frequency limiter 25 to fall within a predetermined limit range to generate a frequency control value Fc2A. Adder 27 adds voltage value Fcr representing rated value fcr for the commercial frequency to frequency control value Fc2A to generate frequency command value Fc3. Oscillator 28 generates AC signal vac having frequency fo corresponding to frequency command value Fc3.

Figure 13:
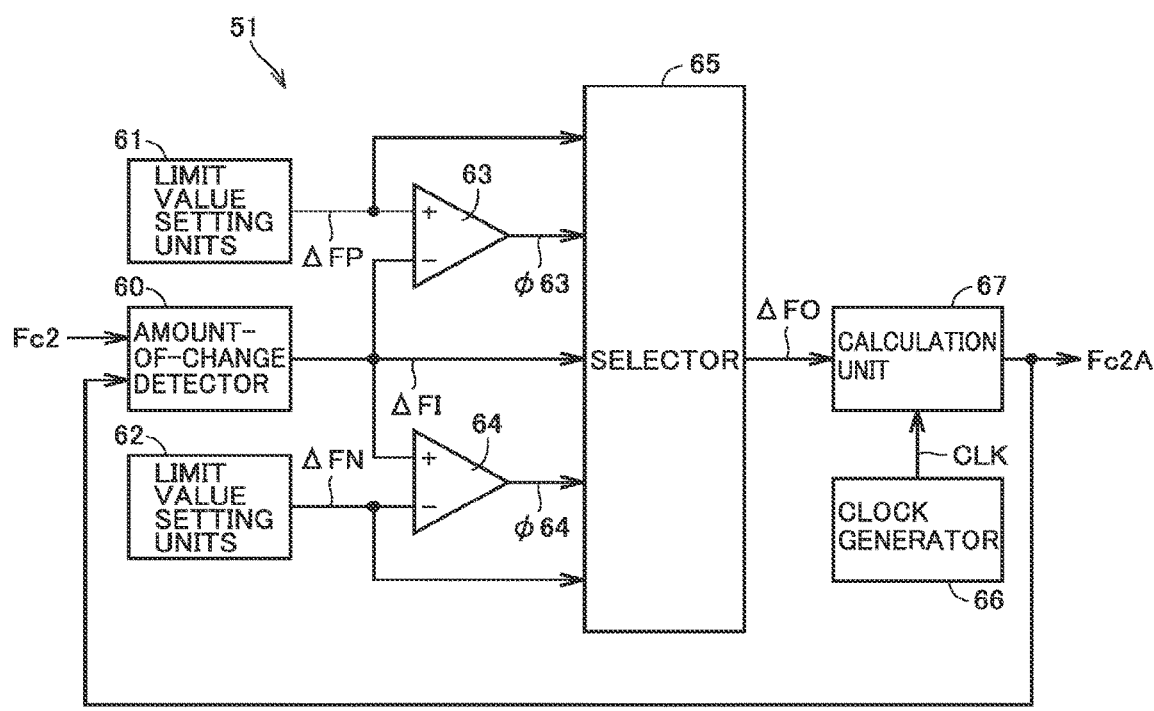
FIG. 13 is a block diagram showing a configuration of an amount-of-change limiter shown in FIG. 12.

FIG. 13 is a block diagram showing a configuration of amount-of-change limiter 51. In FIG. 13, amount-of-change limiter 51 includes an amount-of-change detector 60, limit value setting units 61 and 62, comparators 63 and 64, a selector 65, a clock generator 66, and a calculation unit 67.

Amount-of-change detector 60 detects an amount of change $\Delta$FI, which is a difference between frequency control value Fc2 generated by frequency limiter 25 (FIG. 12) and frequency control value Fc2A generated by calculation unit 67, i.e., $\Delta$FI=Fc2 −Fc2A.

Limit value setting unit 61 sets a positive limit value $\Delta$FP for amount of change $\Delta$FI. Limit value setting unit 62 sets a negative limit value $\Delta$FN for amount of change $\Delta$FI. Positive limit value $\Delta$FP and negative limit value $\Delta$FN are set to values corresponding to the type of load 6. $\Delta$FN=−$\Delta$FP.

Comparator 63 compares positive limit value $\Delta$FP with amount of change $\Delta$FI, and outputs a signal $\phi$63 indicating a result of the comparison. When $\Delta$FI≤$\Delta$FP, signal $\phi$63 goes to the "H" level. When $\Delta$FI>$\Delta$FP, signal $\phi$63 goes to the "L" level.

Comparator 64 compares amount of change $\Delta$FI with negative limit value $\Delta$FN, and outputs a signal $\phi$64 indicating a result of the comparison. When $\Delta$FI≥$\Delta$FN, signal $\phi$64 goes to the "H" level. When $\Delta$FI<$\Delta$FN, signal $\phi$64 is pulled to the "L" level.

Selector 65 selects one of the values of amount of change $\Delta$FI, positive limit value $\Delta$FP, and negative limit value $\Delta$FN based on signals $\phi$63 and $\phi$64 output from comparators 63 and 64, and outputs the selected value as an amount of change $\Delta$FO.

When signals 63 and +64 are both at the "H" level, $\Delta$FO=$\Delta$FI. When signals 63 and +64 are at the "L" level and the "H" level, respectively, $\Delta$FO=$\Delta$FP. When signals $\phi$63 and $\phi$64 are at the "H" level and the "L" level, respectively, $\Delta$FO=$\Delta$FN.

Figure 14:
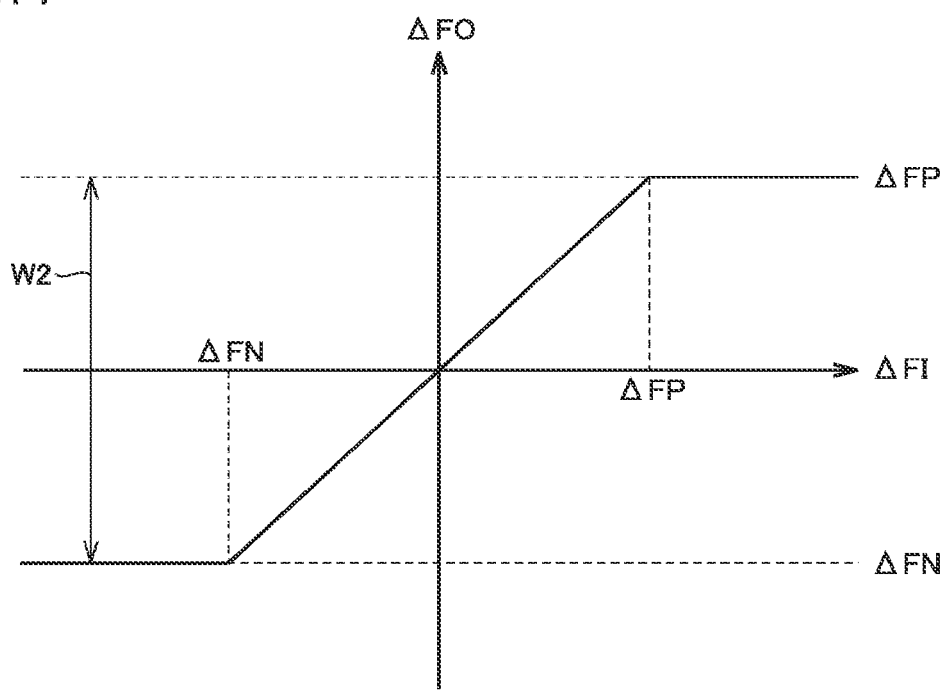
FIG. 14 is a diagram representing an operation of a selector shown in FIG. 13.

FIG. 14 is a diagram representing an operation of selector 65. In FIG. 14, the axis of abscissas represents frequency difference $\Delta$FI, and the axis of ordinates represents amount of change $\Delta$FO. In FIG. 14, when $\Delta$FN≤$\Delta$FI≤$\Delta$FP, $\Delta$FO=$\Delta$FI. When $\Delta$FP<$\Delta$FI, $\Delta$FO=$\Delta$FP. When $\Delta$FI<$\Delta$FN, $\Delta$FO=$\Delta$FN. A range between positive limit value $\Delta$FP and negative limit value $\Delta$FN is an amount-of-change limit range. The amount-of-change limit range has a width W2, which is a difference between positive limit value $\Delta$FP and negative limit value $\Delta$FN (W2=$\Delta$FP−$\Delta$FN).

Referring again to FIG. 13, clock generator 66 generates a clock signal CLK of a predetermined frequency. One period of clock signal CLK is defined as a unit time. In response to each pulse of clock signal CLK (i.e., whenever the unit time elapses), calculation unit 67 adds amount of change $\Delta$FO that is received from selector 65 to the current frequency control value Fc2A to generate a new frequency control value Fc2A. The new frequency control value Fc2A is also fed back to amount-of-change detector 60 and is fed to adder 27 (FIG. 12).

When $\Delta$FN≤$\Delta$FI≤$\Delta$FP, $\Delta$FO=$\Delta$FI, amount of change $\Delta$FO=$\Delta$FI is added to the current frequency control value Fc2A in response to the pulse of clock signal CLK, and the new frequency control value Fc2A matches frequency control value Fc2.

When ΔFP<ΔFI, ΔFO=ΔFP, amount of change ΔFO=ΔFP is added to the current frequency control value Fc2A in response to the pulse of clock signal CLK, and the new frequency control value Fc2A increases by ΔFP. In this case, Fc2A<Fc2.

When ΔFI<ΔFN, ΔFO=ΔFN, amount of change ΔFO=ΔFN is added to the current frequency control value Fc2A in response to the pulse of clock signal CLK, and the new frequency control value Fc2A decreases by ΔFN. In this case, Fc2A>Fc2.

Figure 15:
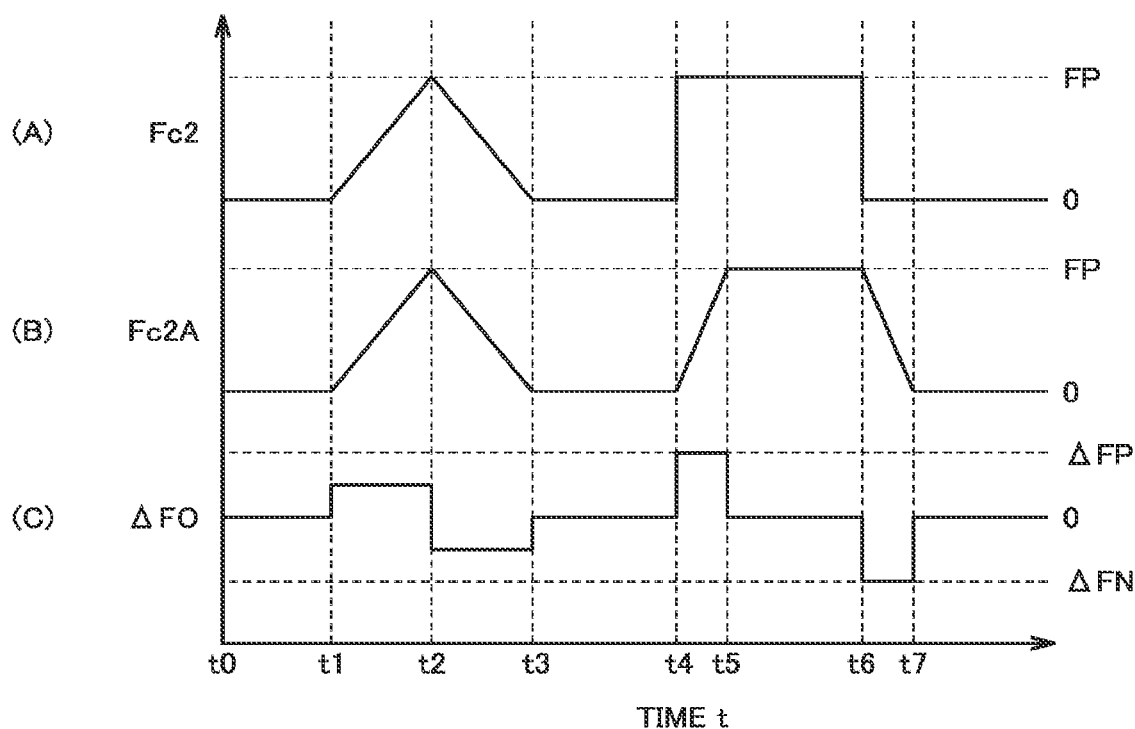
FIG. 15 is timing plots representing an operation of the amount-of-change limiter shown in FIG. 13.

FIG. 15 is timing plots representing an operation of amount-of-change limiter 51. In FIG. 15, (A) represents frequency control value Fc2 in waveform, (B) represents frequency control value Fc2A in waveform, and (C) represents amount of change ΔFO in waveform.

At time t0, it is assumed that frequency control value Fc2 is constant at 0 and Fc2A=Fc2. Then, amount of change ΔFI=Fc2−Fc2A detected by amount-of-change detector 60 (FIG. 13) is 0, signals φ63 and φ64 output from comparators 63 and 64 both go to the "H" level, and selector 65 selects amount of change ΔFI=0 to provide amount of change ΔFO=ΔFI=0. Calculation unit 67 adds amount of change ΔFO=0 to frequency control value Fc2 in response to each pulse of clock signal CLK to generate frequency control value Fc2A=Fc2.

At times t1 to t2, it is assumed that frequency control value Fc2 gently increases from 0 to positive limit value FP at a constant rate. Then, amount of change ΔFI=Fc2−Fc2A has a constant value between positive limit value ΔFP and 0, signals φ63 and φ64 output from comparators 63 and 64 go to the "H" level, and selector 65 selects amount of change ΔFI to provide amount of change ΔFO=ΔFI. Calculation unit 67 adds amount of change ΔFO=ΔFI to frequency control value Fc2 in response to the pulse of clock signal CLK to generate frequency control value Fc2A=Fc2+ΔFI. Thus, frequency control value Fc2A gently increases following frequency control value Fc2.

At times t2 to t3, it is assumed that frequency control value Fc2 gently decreases from positive limit value FP to 0 at a constant rate. Then, amount of change ΔFI=F2−F2A has a constant value between 0 and negative limit value ΔFN, signals φ63 and φ64 output from comparators 63 and 64 both go to the "H" level, and selector 65 selects amount of change ΔFI to provide amount of change ΔFO=ΔFI.

Calculation unit 67 adds amount of change ΔFO=ΔFI to frequency control value Fc2 in response to the pulse of clock signal CLK to generate frequency control value Fc2A=Fc2+ΔFI. Thus, frequency control value Fc2A gently decreases following frequency control value Fc2.

At time t4, it is assumed that frequency control value Fc2 rapidly increases from 0 to positive limit value FP. Then, amount of change ΔFI=Fc2−Fc2A attains a value larger than positive limit value ΔFP, signals φ63 and φ64 output from comparators 63 and 64 are pulled to the "L" level and the "H" level, respectively, and selector 65 selects positive limit value ΔFP to provide amount of change ΔFO=ΔFP. Calculation unit 67 adds amount of change ΔFO=ΔFP to frequency control value Fc2 in response to each pulse of clock signal CLK to generate frequency control value Fc2A=Fc2+ΔFP. Thus, frequency control value Fc2A increases at a constant rate toward positive limit value FP.

When amount of change ΔFI=Fc2−Fc2A becomes equal to or less than positive limit value ΔFP, signals φ63 and φ64 output from comparators 63 and 64 both go to the "H" level, and selector 65 selects amount of change ΔFI to provide amount of change ΔFO=ΔFI. Calculation unit 67 adds amount of change ΔFO=ΔFI to frequency control value Fc2 in response to the pulse of clock signal CLK to generate frequency control value Fc2A=Fc2+ΔFI. Thus, frequency control value Fc2A increases at the proportion of positive limit value ΔFP per unit time to reach frequency control value Fc2=FP (at time t5).

At time t6, it is assumed that frequency control value Fc2 rapidly decreases from positive limit value FP to 0. Then, amount of change ΔFI=Fc2−Fc2A has a value more negative than negative limit value ΔFN, signals φ63 and φ64 output from comparators 63 and 64 are pulled to the "H" level and the "L" level, respectively, and selector 65 selects negative limit value ΔFN to provide amount of change ΔFO=ΔFN. Calculation unit 67 adds amount of change ΔFO=ΔFN to frequency control value Fc2 in response to each pulse of clock signal CLK to generate frequency control value Fc2A=Fc2+ΔFN. Thus, frequency control value Fc2A decreases at a constant rate toward 0.

When amount of change ΔFI=Fc2−Fc2A becomes equal to or larger than negative limit value ΔFN, signals φ63 and φ64 output from comparators 63 and 64 both go to the "H" level, and selector 65 selects amount of change ΔFI to provide amount of change ΔFO=ΔFI. Calculation unit 67 adds amount of change ΔFO=ΔFI to frequency control value Fc2 in response to the pulse of clock signal CLK to generate frequency control value Fc2A=Fc2+ΔFI. Thus, frequency control value Fc2A decreases at the proportion of negative limit value ΔFN per unit time to reach frequency control value Fc2=FN. The remainder in configuration and operation will not be described as it is identical to that of the first embodiment.

Thus, in the second embodiment, amount-of-change limiter 51 can be provided at a stage subsequent to frequency limiter 25 to limit amount of change ΔFO per unit time of frequency control value Fc2 to fall within a limit range to prevent frequency fo of AC signal vac from rapidly changing. This can prevent frequency fo of AC voltage VO from rapidly changing and negatively affecting load 6 for a period of time elapsing since commercial AC power source 5 recovers from a power failure state to a sound state until high speed switch 1 is turned on.

Note that removing frequency limiter 25 and limiter control unit 26 from phase synchronization control circuit 50 and providing amount-of-change limiter 51 at a stage subsequent to frequency control unit 21 can also prevent frequency fo of AC voltage VO from rapidly changing and negatively affecting load 6.

It should be understood that the embodiments disclosed herein are illustrative and non-restrictive in any respect. The present invention is indicated by the appended claims rather than by the above description, and intended to encompass any modification within the meaning and scope equivalent to the terms of the claims.

REFERENCE SIGNS LIST

T1 input terminal, T2 output terminal, T3 DC terminal, B1-B4 breaker, 1 high speed switch, 2 transformer, 3 bidirectional converter, 4 control device, 5 commercial AC power source, 6 load, 7 battery, 11 power failure detector, 12, 50 phase synchronization control circuit, 13 synchronization detector, 14 control unit, 20 phase difference detector, 21 frequency control unit, 22 proportional calculation unit, 23 integral calculation unit, 24, 27, 43 adder, 25 frequency limiter, 26 limiter control unit, 28 oscillator, 31, 32, 63, 64 comparator, 33, 65 selector, 40 absolute value calculation unit, 41 limit value calculation unit, 42 frequency detector, 42A reference value calculation unit, 44 subtractor, 45 maximum value setting unit, 46, 48 limit value limiter, 47 minimum value setting unit, 51 amount-of-change limiter, 60 amount-of-change detector, 61, 62 limit value setting unit, 66 clock generator, 67 calculation unit.

The invention claimed is:

1. A phase synchronization control circuit that generates a second alternating-current signal in phase with a first alternating-current signal, comprising:
   a phase difference detector that detects a phase difference between the first and second alternating-current signals;
   a frequency control circuit that generates a first frequency control value to eliminate the phase difference;
   a frequency limiter that limits the first frequency control value to fall within a first limit range to generate a second frequency control value;
   a limiter control circuit that sets the first limit range based on the phase difference and reduces the first limit range in width in response to the phase difference decreasing; and
   an alternating-current signal generation circuit that generates the second alternating-current signal with a frequency of a value corresponding to the second frequency control value.

2. The phase synchronization control circuit according to claim 1, wherein
   the first limit range is a range between a first limit value and a second limit value lower than the first limit value,
   the first limit range has a width equal to a difference between the first and second limit values,
   the limiter control circuit sets the first and second limit values based on a magnitude of the phase difference, and
   the frequency limiter:
      outputs the first limit value as the second frequency control value when the first frequency control value is higher than the first limit value;
      outputs the first frequency control value as the second frequency control value when the first frequency control value is between the first and second limit values; and
      outputs the second limit value as the second frequency control value when the first frequency control value is lower than the second limit value.

3. The phase synchronization control circuit according to claim 2, wherein the limiter control circuit:
   determines a reference value based on a frequency of the first alternating-current signal;
   determines a third limit value based on the magnitude of the phase difference;
   adds the third limit value to the reference value to determine the first limit value;
   subtracts the third limit value from the reference value to determine the second limit value; and
   decreases the third limit value in magnitude from a maximum value to a minimum value in response to the magnitude of the phase difference decreasing, wherein the minimum value for the third limit value is larger than 0.

4. The phase synchronization control circuit according to claim 1, further comprising an amount-of-change limiter that is provided between the frequency limiter and the alternating-current signal generation circuit and limits an amount of change per unit time of the second frequency control value to fall within a second limit range to generate a third frequency control value, wherein
   the alternating-current signal generation circuit generates the second alternating-current signal with a frequency of a value corresponding to the third frequency control value.

5. The phase synchronization control circuit according to claim 4, wherein
   the second limit range is a range between a positive limit value and a negative limit value,
   the amount-of-change limiter includes
      an amount-of-change detector that detects a difference between the second frequency control value and the third frequency control value as an amount of change of the second frequency control value, and
      a calculation circuit that updates the third frequency control value, based on the amount of change of the second frequency control value, the positive limit value, and the negative limit value, whenever the unit time elapses,
   whenever the unit time elapses, the calculation circuit:
      adds the positive limit value to the third frequency control value when the amount of change of the second frequency control value is higher than the positive limit value;
      adds the amount of change of the second frequency control value to the third frequency control value when the amount of change of the second frequency control value is between the positive limit value and the negative limit value; and
      adds the negative limit value to the second frequency control value when the amount of change of the second frequency control value is lower than the negative limit value.

6. The phase synchronization control circuit according to claim 1, wherein
   the alternating-current signal generation circuit includes
      an adder that adds a rated value for a frequency of the first alternating-current signal to the second frequency control value to generate a frequency command value, and
      an oscillator that generates the second alternating-current signal with a frequency of a value corresponding to the frequency command value.

7. A power conversion device comprising:
   the phase synchronization control circuit according to claim 1;
   a switch having a first terminal receiving a first alternating-current voltage supplied from an alternating-current power source, and a second terminal connected to a load;
   an inverter that receives direct-current voltage from a direct-current power source, converts the received direct-current voltage to a second alternating-current voltage, and supplies the second alternating-current voltage to the load; and
   a control circuit that controls the switch and the inverter based on the second alternating-current signal received from the phase synchronization control circuit,
   wherein
      the first alternating-current signal is synchronized with the first alternating-current voltage and the second alternating-current voltage is synchronized with the second alternating-current signal,
   the control circuit:

when the alternating-current power source is sound, turns on the switch to supply alternating-current power from the alternating-current power source to the load via the switch;

when the alternating-current power source fails, turns off the switch to supply alternating-current power from the inverter to the load; and when the alternating-current power source recovers from a power failure state to a sound state, turns on the switch in response to the first and second alternating-current voltages matching in frequency and phase.

8. A phase synchronization control circuit that generates a second alternating-current signal in phase with a first alternating-current signal, comprising:

a phase difference detector that detects a phase difference between the first and second alternating-current signals;

a frequency control circuit that generates a first frequency control value to eliminate the phase difference;

an amount-of-change limiter that limits an amount of change of the first frequency control value per unit time to fall within a limit range to generate a second frequency control value; and an alternating-current signal generation circuit that generates the second alternating-current signal with a frequency of a value corresponding to the second frequency control value.

9. The phase synchronization control circuit according to claim 8, wherein the limit range is a range between a positive limit value and a negative limit value, the amount-of-change limiter includes
an amount-of-change detector that detects a difference between the first frequency control value and the second frequency control value as the amount of change of the first frequency control value, and a calculation circuit that updates the second frequency control value, based on the amount of change of the first frequency control value, the positive limit value, and the negative limit value, whenever the unit time elapses, whenever the unit time elapses, the calculation circuit:
adds the positive limit value to the second frequency control value when the amount of change of the first frequency control value is higher than the positive limit value;

adds the amount of change of the first frequency control value to the first frequency control value when the amount of change of the first frequency control value is between the positive limit value and the negative limit value; and adds the negative limit value to the first frequency control value when the amount of change of the first frequency control value is lower than the negative limit value.

10. A power conversion device comprising:
the phase synchronization control circuit according to claim 9;

a switch having a first terminal receiving a first alternating-current voltage supplied from an alternating-current power source, and a second terminal connected to a load;

an inverter that receives direct-current voltage from a direct-current power source, converts the received direct-current voltage to a second alternating-current voltage, and supplies the second alternating-current voltage to the load; and a control circuit that controls the switch and the inverter based on the second alternating-current signal received from the phase synchronization control circuit, wherein the first alternating-current signal is synchronized with the first alternating-current voltage and the second alternating-current voltage is synchronized with the second alternating-current signal, the control circuit:
when the alternating-current power source is sound, turns on the switch to supply alternating-current power from the alternating-current power source to the load via the switch;

when the alternating-current power source fails, turns off the switch to supply alternating-current power from the inverter to the load; and when the alternating-current power source recovers from a power failure state to a sound state, turns on the switch in response to the first and second alternating-current voltages matching in frequency and phase.

11. The phase synchronization control circuit according to claim 8, wherein the alternating-current signal generation circuit includes
an adder that adds a rated value for a frequency of the first alternating-current signal to the second frequency control value to generate a frequency command value, and an oscillator that generates the second alternating-current signal with a frequency of a value corresponding to the frequency command value.

12. A power conversion device comprising:
the phase synchronization control circuit according to claim 11;

a switch having a first terminal receiving a first alternating-current voltage supplied from an alternating-current power source, and a second terminal connected to a load;

an inverter that receives direct-current voltage from a direct-current power source, converts the received direct-current voltage to a second alternating-current voltage, and supplies the second alternating-current voltage to the load; and a control circuit that controls the switch and the inverter based on the second alternating-current signal received from the phase synchronization control circuit, wherein the first alternating-current signal is synchronized with the first alternating-current voltage and the second alternating-current voltage is synchronized with the second alternating-current signal, the control circuit:
when the alternating-current power source is sound, turns on the switch to supply alternating-current power from the alternating-current power source to the load via the switch;

when the alternating-current power source fails, turns off the switch to supply alternating-current power from the inverter to the load; and when the alternating-current power source recovers from a power failure state to a sound state, turns on the switch in response to the first and second alternating-current voltages matching in frequency and phase.

13. A power conversion device comprising:

the phase synchronization control circuit according to claim 8;

a switch having a first terminal receiving a first alternating-current voltage supplied from an alternating-current power source, and a second terminal connected to a load;

an inverter that receives direct-current voltage from a direct-current power source, converts the received direct-current voltage to a second alternating-current voltage, and supplies the second alternating-current voltage to the load; and a control circuit that controls the switch and the inverter based on the second alternating-current signal received from the phase synchronization control circuit, wherein the first alternating-current signal is synchronized with the first alternating-current voltage and the second alternating-current voltage is synchronized with the second alternating-current signal, the control circuit:

when the alternating-current power source is sound, turns on the switch to supply alternating-current power from the alternating-current power source to the load via the switch;

when the alternating-current power source fails, turns off the switch to supply alternating-current power from the inverter to the load; and when the alternating-current power source recovers from a power failure state to a sound state, turns on the switch in response to the first and second alternating-current voltages matching in frequency and phase.

* * * * *